(12) United States Patent
Lu

(10) Patent No.: US 11,721,652 B2
(45) Date of Patent: Aug. 8, 2023

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 187 days.

(21) Appl. No.: 17/078,070

(22) Filed: Oct. 22, 2020

(65) Prior Publication Data

US 2022/0130776 A1    Apr. 28, 2022

(51) Int. Cl.
| | |
|---|---|
| *H01L 23/00* | (2006.01) |
| *H01L 23/66* | (2006.01) |
| *H01L 23/498* | (2006.01) |
| *H01L 21/48* | (2006.01) |
| *H01Q 1/38* | (2006.01) |

(52) U.S. Cl.
CPC .......... *H01L 23/66* (2013.01); *H01L 21/4853* (2013.01); *H01L 21/4857* (2013.01); *H01L 23/4985* (2013.01); *H01L 23/49822* (2013.01); *H01L 23/49838* (2013.01); *H01L 24/16* (2013.01); *H01Q 1/38* (2013.01); *H01L 2223/6677* (2013.01); *H01L 2224/16227* (2013.01)

(58) Field of Classification Search
CPC . H01L 23/66; H01L 21/4853; H01L 21/4857; H01L 23/49822; H01L 23/49838; H01L 23/4985; H01L 24/16; H01L 2223/6677; H01L 2224/16227; H01Q 1/38; H01Q 21/205; H01Q 21/28; H01Q 1/2283
USPC ........................................................ 257/428
See application file for complete search history.

(56) References Cited

U.S. PATENT DOCUMENTS

| | | |
|---|---|---|
| 2018/0034134 A1 | 2/2018 | Dalmia |
| 2022/0169172 A1* | 6/2022 | Yang ........................ B60Q 1/54 |

* cited by examiner

*Primary Examiner* — Elias Ullah
(74) *Attorney, Agent, or Firm* — Foley & Lardner LLP

(57) ABSTRACT

A semiconductor device package includes an electronic component and a substrate. The electronic component has a first surface and a second surface. The substrate is connected to the first surface of the electronic component through an adhesive layer. The substrate includes a first antenna disposed over the second surface of the electronic components through the adhesive layer.

14 Claims, 31 Drawing Sheets

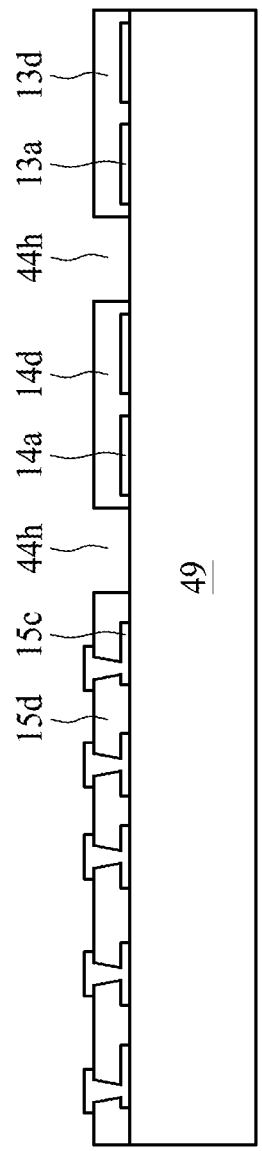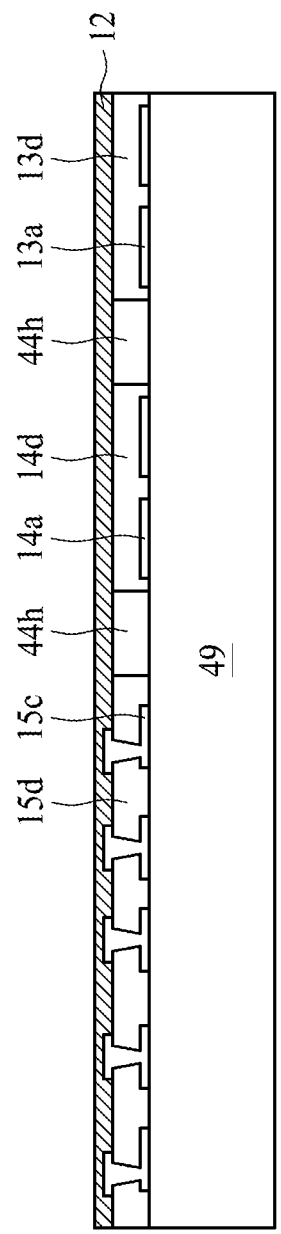

SEMICONDUCTOR DEVICE PACKAGE AND METHOD OF MANUFACTURING THE SAME

BACKGROUND

1. Technical Field

The present disclosure relates to a semiconductor device package and a method of manufacturing the same, and more particularly to a semiconductor device package including an antenna structure and a method of manufacturing the same.

2. Description of the Related Art

Wireless communication devices, such as cell phones, typically include antennas for transmitting and receiving radio frequency (RF) signals. In order to achieve higher bandwidth, lower latency, and higher data transmission rates in wireless communication devices, millimeter wave frequency bands are introduced. However, the millimeter wave transmission brings many technical challenges. One of the major problems is the high path loss when the signal propagates. Therefore, directional antennas are commonly used in wireless communication devices (such as smart phones) to increase the gain of the signal. However, to configure multiple directional antennas radiating in various directions, a wireless communication device may be equipped with multiple antenna modules, which would increase the cost and the size of the wireless communication device.

SUMMARY

In accordance with some embodiments of the present disclosure, a semiconductor device package includes an electronic component and a substrate. The electronic component has a first surface and a second surface. The substrate is connected to the first surface of the electronic component through an adhesive layer. The substrate includes a first antenna disposed over the second surface of the electronic components through the adhesive layer.

In accordance with some embodiments of the present disclosure, a semiconductor device package includes an electronic component and a substrate. The electronic component has a first surface and an active surface adjacent to the first surface. The substrate is connected to the electronic component and has an interconnection structure. The substrate includes a first antenna disposed over the first surface of the electronic components. A signal transmission path from the first antenna to the electronic component includes the first surface of the electronic component, the interconnection structure of the substrate, and an active surface of the electronic component.

In accordance with some embodiments of the present disclosure, a method of manufacturing a semiconductor device package includes (a) providing a flexible substrate having a first antenna; (b) attaching an electronic component to the flexible substrate through an adhesive layer; and (c) bending the flexible substrate to align the first antenna with a first surface of the electronic component.

BRIEF DESCRIPTION OF THE DRAWINGS

FIG. 4A, FIG. 4B, FIG. 4C, FIG. 4D, FIG. 4E, FIG. 4F, FIG. 4G, FIG. 4H, FIG. 4I, FIG. 4J, FIG. 4K, and FIG. 4L illustrate cross-sectional views of a semiconductor manufacturing method, in accordance with some embodiments of the present disclosure.

FIG. 4E', FIG. 4F', and FIG. 4G' illustrate top views of the structures as shown in FIG. 4E, FIG. 4F, and FIG. 4G, in accordance with some embodiments of the present disclosure.

Figure 1A:
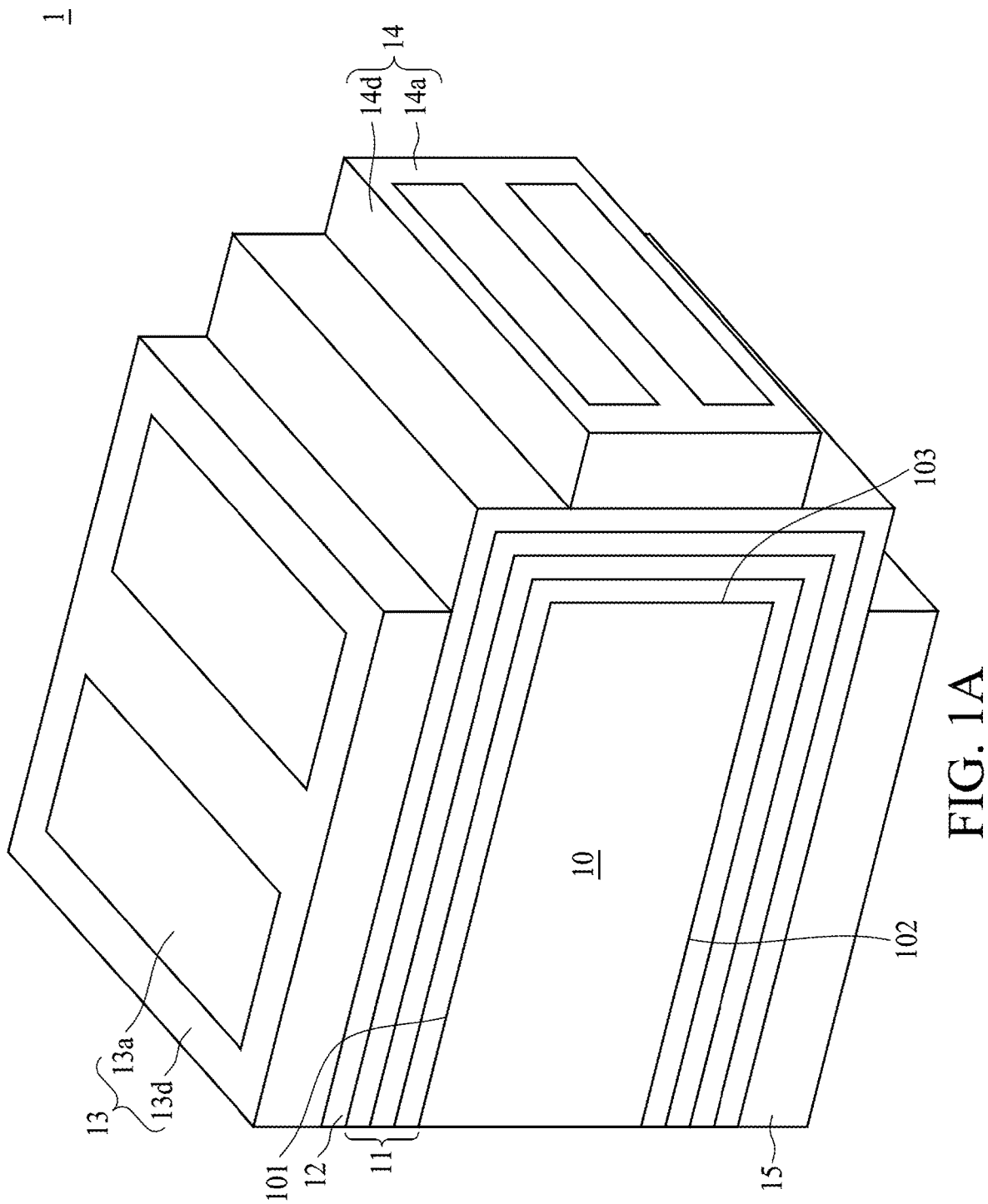
FIG. 1A illustrates a perspective view of a part of a semiconductor device package, in accordance with some embodiments of the present disclosure.

Common reference numerals are used throughout the drawings and the detailed description to indicate the same or similar components. The present disclosure will be readily understood from the following detailed description taken in conjunction with the accompanying drawings.

DETAILED DESCRIPTION

Figure 1B:
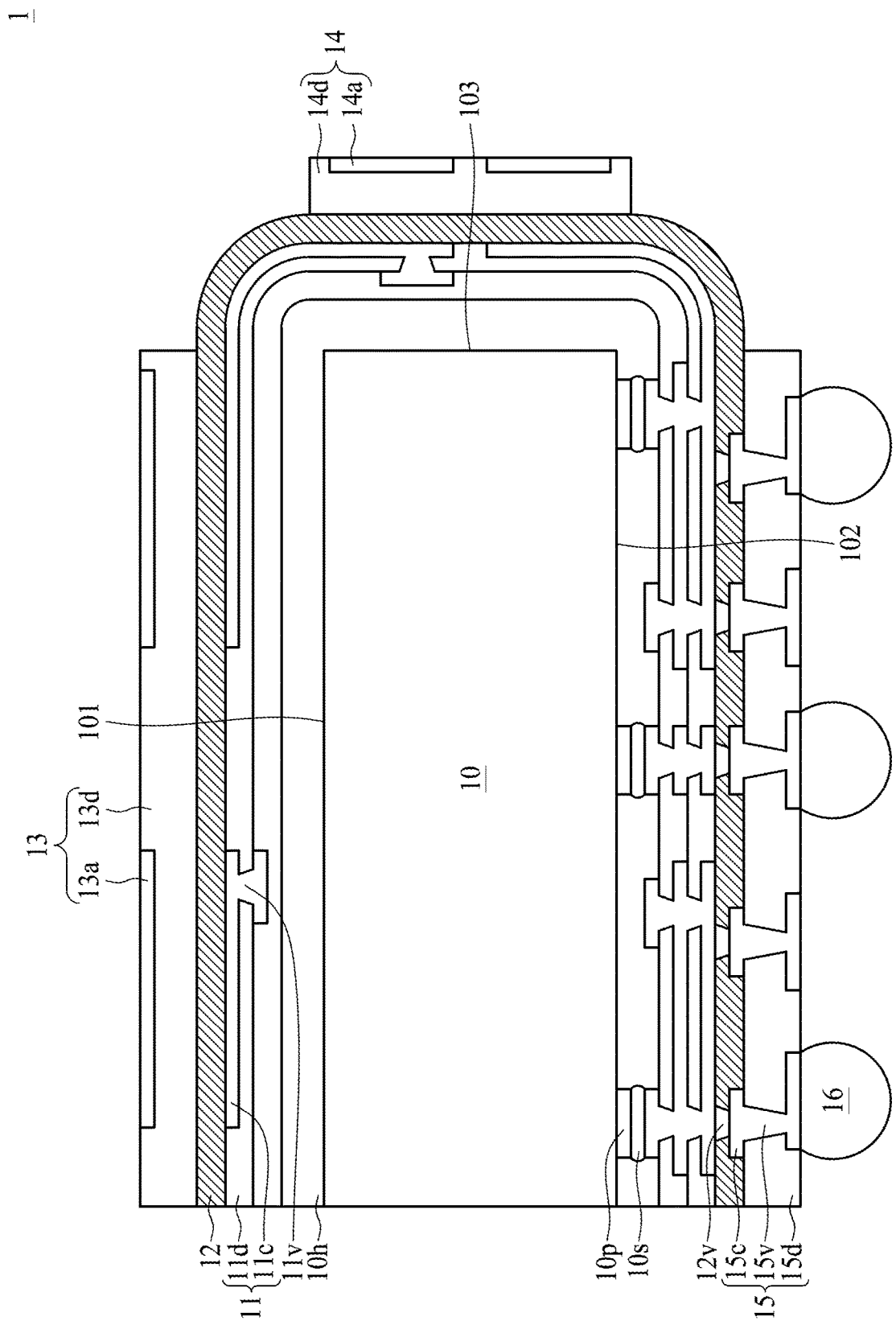
FIG. 1B illustrates a cross-sectional view of the part of the semiconductor device package as shown in FIG. 1A, in accordance with some embodiments of the present disclosure.

FIG. 1A illustrates a perspective view of a part of a semiconductor device package 1, in accordance with some embodiments of the present disclosure. FIG. 1B illustrates a cross-sectional view of the part of the semiconductor device package 1, in accordance with some embodiments of the present disclosure. The semiconductor device package 1 includes an electronic component 10, a circuit layer 11, a dielectric layer 12, antenna layers 13, 14 and a circuit layer 15.

The electronic component 10 has a surface 101 (e.g., a backside surface), a surface 102 (e.g., an active surface) opposite to the surface 101 and a lateral surface 103 extending between the surface 101 and the surface 102. The electronic component 10 may be a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof. In some embodiments, the electronic component 11 may be or include a semiconductor package device or a system in package (SiP).

The circuit layer 11 (or building-up circuit) surrounds the electronic component 10. For example, the circuit layer 11 is disposed on the surfaces 101, 102 and the lateral surface 103 of the electronic component 10. The circuit layer 11 may be connected to (or attached to) the surfaces 101, 102 and the lateral surface 103 of the electronic component 10 through an adhesive layer 10h (e.g., a tape or an attach film). For example, the adhesive layer 10h is in contact with the surfaces 101, 102 and the lateral surface 103 of the electronic component 10. For example, the adhesive layer 10h is in contact with the circuit layer 11. The circuit layer 11 may be or include a flexible material, so that the circuit layer 11 can be bent to surround the electronic component 10. In some embodiments, the circuit layer 11 may be or include a flexible printed circuit board (FPC).

The circuit layer 11 may include one or more conductive layers (e.g., redistribution layers, RDLs, conductive vias, conductive pads or the like) 11c, 11v and one or more dielectric layers 11d. A portion of the conductive layer 11c is covered or encapsulated by the dielectric layer 11d while another portion of the conductive layer 11c is exposed from the dielectric layer 11d to provide electrical connections. For example, the electronic component 10 may include conductive pads (or pins or bumps or pillars) 10p on its surface 102, and the conductive pads 10p are electrically connected to the conductive layer 11c of the circuit layer 11 through, for example, electrical contacts (e.g., solder balls or bumps) 10s. The circuit layer 11 may be electrically connected to the circuit layer 15 through conductive vias 12v penetrating the dielectric layer 12.

In some embodiments, the dielectric layer 11d may include pre-impregnated composite fibers (e.g., pre-preg), Borophosphosilicate Glass (BPSG), silicon oxide, silicon nitride, silicon oxynitride, Undoped Silicate Glass (USG), any combination of two or more thereof, or the like. Examples of a pre-preg may include, but are not limited to, a multi-layer structure formed by stacking or laminating a number of pre-impregnated materials/sheets. In some embodiments, there may be any number of conductive layers or dielectric layers depending on design specifications. In some embodiments, the conductive layers 11c, 11v may be formed of or include gold (Au), silver (Ag), copper (Cu), platinum (Pt), palladium (Pd), other metal(s) or alloy(s), or a combination of two or more thereof.

The dielectric layer 12 is disposed on the circuit layer 11. The dielectric layer 12 may be conformally disposed on the circuit layer 11. In some embodiments, the dielectric layer 12 may be or include a dry film. In some embodiments, a dielectric constant (Dk) or a dielectric loss tangent (Dk) of the dielectric layer 12 is less than a Dk or a Df of the surface 101 and the surface 102 of the electronic component 10. In some embodiments, the Dk and the Df of the dielectric layer 12 is less than a Dk or a Df of silicon.

The antenna layer 13 (or antenna module) is disposed over the surface 101 of the electronic component 10. The antenna layer 13 is in contact with the dielectric layer 12. The antenna layer 13 may include an antenna pattern 13a and a dielectric layer 13d. The antenna pattern 13a is partially embedded within the dielectric layer 13d, and a top surface of the antenna pattern 13a is exposed from the dielectric layer 13d. For example, the top surface of the antenna pattern 13a is substantially coplanar with a top surface of the dielectric layer 13d. In some embodiments, the antenna pattern 13a may function as a director and the conductive layer 11c of the circuit layer 11 may function as a radiator. The antenna pattern 13a may be configured to radiate electromagnetic wave in a direction substantially perpendicular to the surface 101 of the electronic component 10.

In some embodiments, the dielectric layer 13d may include pre-impregnated composite fibers (e.g., pre-preg), BPSG, silicon oxide, silicon nitride, silicon oxynitride, USG, any combination of two or more thereof, or the like. Examples of a pre-preg may include, but are not limited to, a multi-layer structure formed by stacking or laminating a number of pre-impregnated materials/sheets. In some embodiments, there may be any number of antenna layers or dielectric layers depending on design specifications. In some embodiments, the antenna layer 13a may be formed of or include Au, Ag, Cu, Pt, Pd, other metal(s) or alloy(s), or a combination of two or more thereof.

Figure 1C:
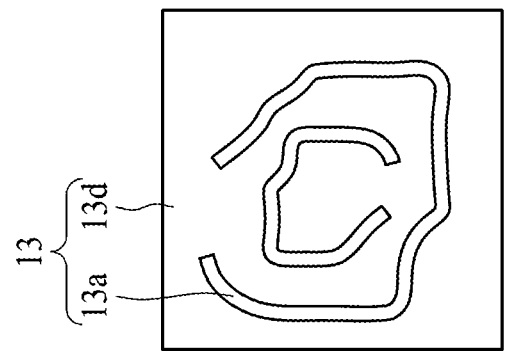
FIG. 1C, FIG. 1D, FIG. 1E, FIG. 1F, FIG. 1G, and FIG. 1H illustrate top views of an antenna layer, in accordance with some embodiments of the present disclosure.
Figure 1F:
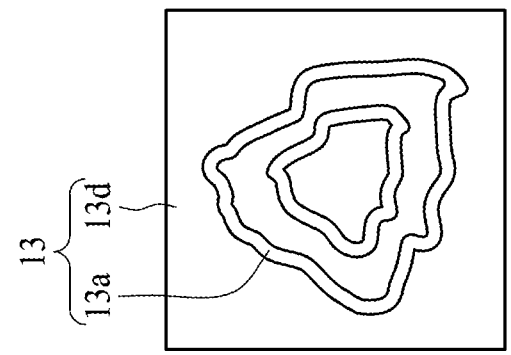
Figure 1D:
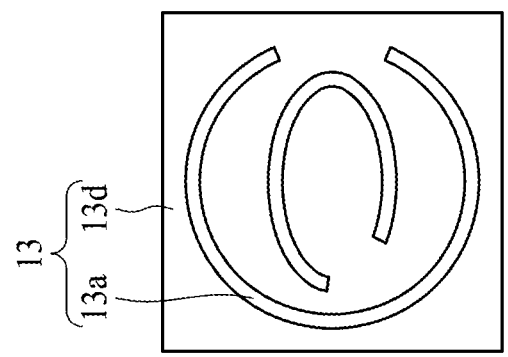
Figure 1G:
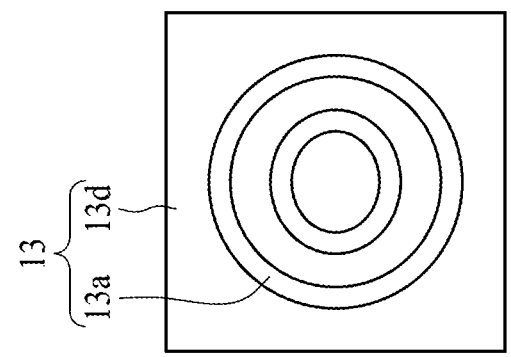
Figure 1E:
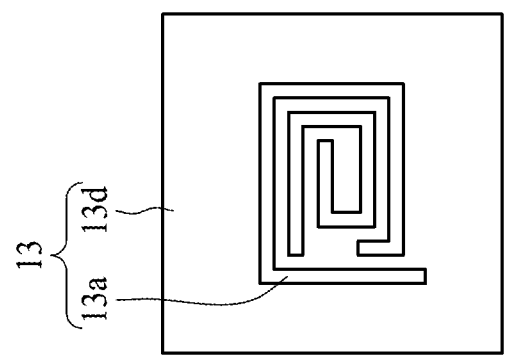
Figure 1H:
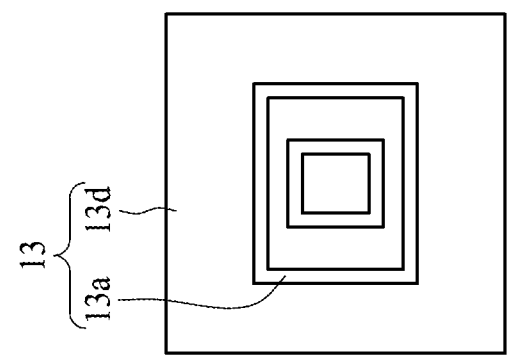

The antenna pattern 13a may have various shapes depending on different design requirements. For example, as shown in FIGS. 1C, 1D, 1E, 1F, 1G, and 1H, which illustrate top views of the antenna layer 13, the antenna pattern 13a may be rectangular (e.g., FIGS. 1C and 1F), circular (e.g., FIGS. 1D and 1G), or irregular (e.g., FIGS. 1E and 1H). In some embodiments, the antenna pattern 13a may include an open-loop pattern as shown in FIGS. 1C, 1D, and 1E. In some embodiments, the antenna pattern 13a may include a closed-loop pattern as shown in FIGS. 1F, 1G, and 1H.

The antenna layer 14 (or antenna module) is disposed over the lateral surface 103 of the electronic component 10. The antenna layer 14 is in contact with the dielectric layer 12. The antenna layer 14 may include an antenna pattern 14a and a dielectric layer 14d. The antenna layer 14 is the same as or similar to the antenna layer 13, and thus the descriptions of the antenna layer 13 can be applicable to the antenna layer 14.

The electronic component 10, the circuit layer 11 and the dielectric layer 12 are disposed on the circuit layer 15 and electrically connected to the circuit layer 15. The circuit layer 15 may include one or more conductive layers (e.g., redistribution layers, RDLs, conductive vias, conductive pads or the like) 15c, 15v and one or more dielectric layers 15d. A portion of the conductive layer 15c is covered or encapsulated by the dielectric layer 15d while another portion of the conductive layer 15c is exposed from the dielectric layer 15d to provide electrical connections.

The electrical contacts 16 (e.g., solder balls) are electrically connected to the substrate 15 to provide electrical connections between the semiconductor device package 1 with external components (e.g. external circuits or circuit boards). In some embodiments, the electrical contacts 16 includes controlled collapse chip connection (C4) bumps, ball grid array (BGA) or land grid array (LGA).

In some embodiments, the circuit layer 11, the dielectric layer 12, the antenna layers 13, 14, and the circuit layer 15 may be collectively referred to as a substrate (antenna substrate or an antenna module). The substrate may have a first portion on which the antenna layer 13 is disposed, a second portion on which the antenna layer 14 is disposed, and a third portion on which the circuit layer 15 is disposed. The first portion of the substrate extends along the surface 101 of the electronic component 10. The second portion of the substrate extends along the lateral surface 103 of the electronic component 10. The third portion of the substrate extends along the surface 102 of the electronic component 10. For example, the substrate may be conformally disposed on the surfaces 101, 102, and 103 of the electronic component 10.

In some embodiments, the signal transmission between the antenna layer 13 and the electronic component 10 may be achieved by the substrate. For example, the electromagnetic waves or signal received by the antenna layer 13 can be transmitted to the circuit layer 11 through, for example, coupling. The signal is then transmitted along the surface 101, the lateral surface 103, and the surface 102 of the electronic component 10 to the conductive pads 10p of the electronic component 10 for the subsequent processing. Similarly, the signal from the electronic component 10 may be transmitted along the surface 102, the lateral surface 103, and the surface 101 of the electronic component 10. The signal is then transmitted to the antenna layer 13 through, for example, coupling and radiated by the antenna layer 13.

In some embodiments, the signal transmission between the antenna layer 14 and the electronic component 10 may be achieved by the substrate. For example, the electromagnetic waves or signal received by the antenna layer 14 can be transmitted to the circuit layer 11 through, for example, coupling. The signal is then transmitted along the lateral surface 103 and the surface 102 of the electronic component 10 to the conductive pads 10p of the electronic component 10 for the subsequent processing. Similarly, the signal from the electronic component 10 may be transmitted along the surface 102 and the lateral surface 103 of the electronic component 10. The signal is then transmitted to the antenna layer 14 through, for example, coupling and radiated by the antenna layer 14.

Since the signal transmission between the antenna layer 13 or 14 and the electronic component 10 is mainly achieved by the substrate, the signal loss and the latency can be reduced by choosing the materials of the substrate having a relatively lower Dk and Df.

In some comparative embodiments, to achieve multiple directional antennas radiating in various directions, a wireless communication device may be equipped with multiple antenna modules. However, this would increase the cost and the size of the wireless communication device. To solve the above problems, a single antenna module having antennas disposed on multiple surfaces of the antenna module is provided. The antennas of said antenna module may be formed by substrate lamination processes or build-up processes. However, as the radiation directions increase, the number of layers of the substrate increases as well, which would reduce the yield rate of the antenna module and adversely affect the performance of the antenna module.

In accordance with the embodiments as shown in FIGS. 1A-1H, the substrate including the antenna layers 13 and 14 is attached to the electronic component 10, wherein the antenna layers 13 and 14 are disposed over different surfaces (e.g., the surface 101 and the lateral surface 103) of the electronic component 10. The substrate includes a FPC board (e.g., the circuit layer 11), so that the substrate can be bendably disposed along the edges of the electronic component 10. The substrate may also have openings to expose corresponding bending portions (or flexions). Hence, the semiconductor device package 1 can achieve multi-directional radiation without increasing its manufacturing cost and size. In addition, a substate having a relatively large number of layers to accommodate the antennas is not required, which can enhance the performance of the semiconductor device package 1.

Figure 2A:
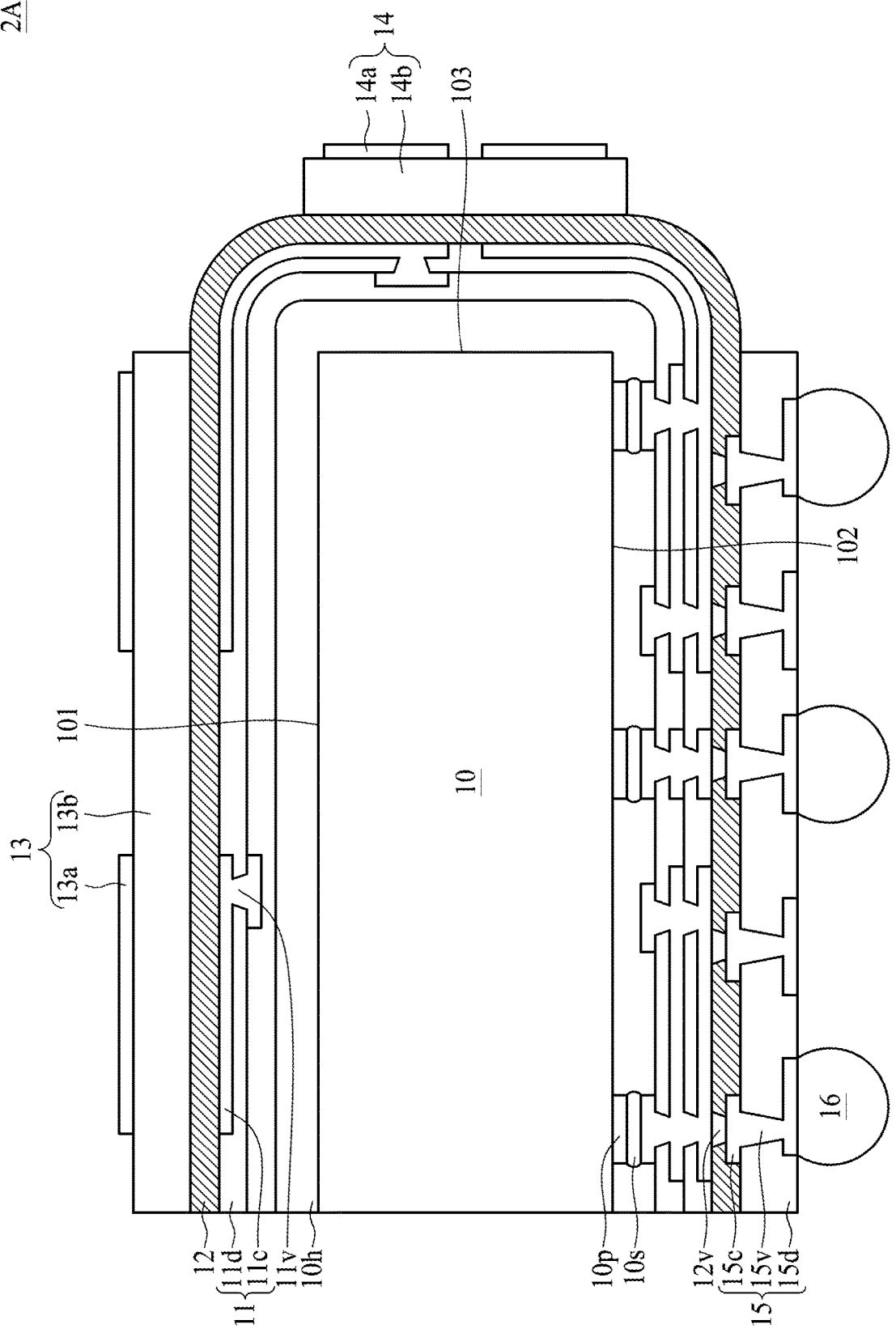
FIG. 2A illustrates a cross-sectional view of the part of a semiconductor device package, in accordance with some embodiments of the present disclosure.

FIG. 2A illustrates a cross-sectional view of a part of a semiconductor device package 2A, in accordance with some embodiments of the present disclosure. The semiconductor device package 2A is similar to the semiconductor device package 1 as shown in FIG. 1B, except that as shown in FIG. 2A, the antenna pattern 13a is disposed on the dielectric layer 13b. For example, the antenna pattern 13a is not embedded within the dielectric layer 13b. Similarly, the antenna pattern 14a is disposed on the dielectric layer 14b without be encapsulated or covered by the dielectric layer 14b.

Figure 2B:
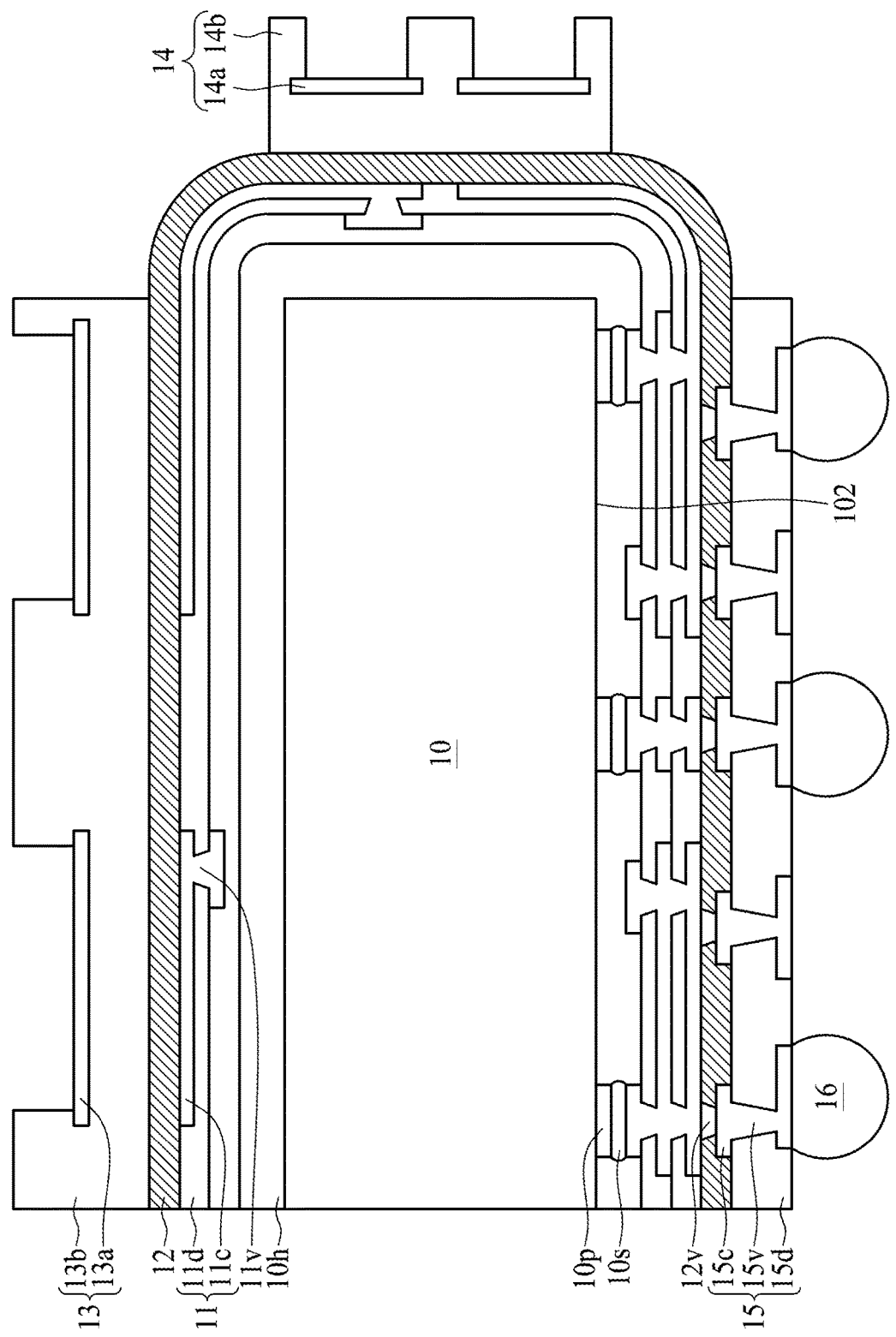
FIG. 2B illustrates a cross-sectional view of the part of a semiconductor device package, in accordance with some embodiments of the present disclosure.

FIG. 2B illustrates a cross-sectional view of a part of a semiconductor device package 2B, in accordance with some embodiments of the present disclosure. The semiconductor device package 2B is similar to the semiconductor device package 1 as shown in FIG. 1B, except that as shown in FIG. 2B, a portion of the top surface of the antenna pattern 13a is covered by the dielectric layer 13b. Similarly, a portion of the top surface of the antenna pattern 14a is covered by the dielectric layer 14b.

Figure 3A:
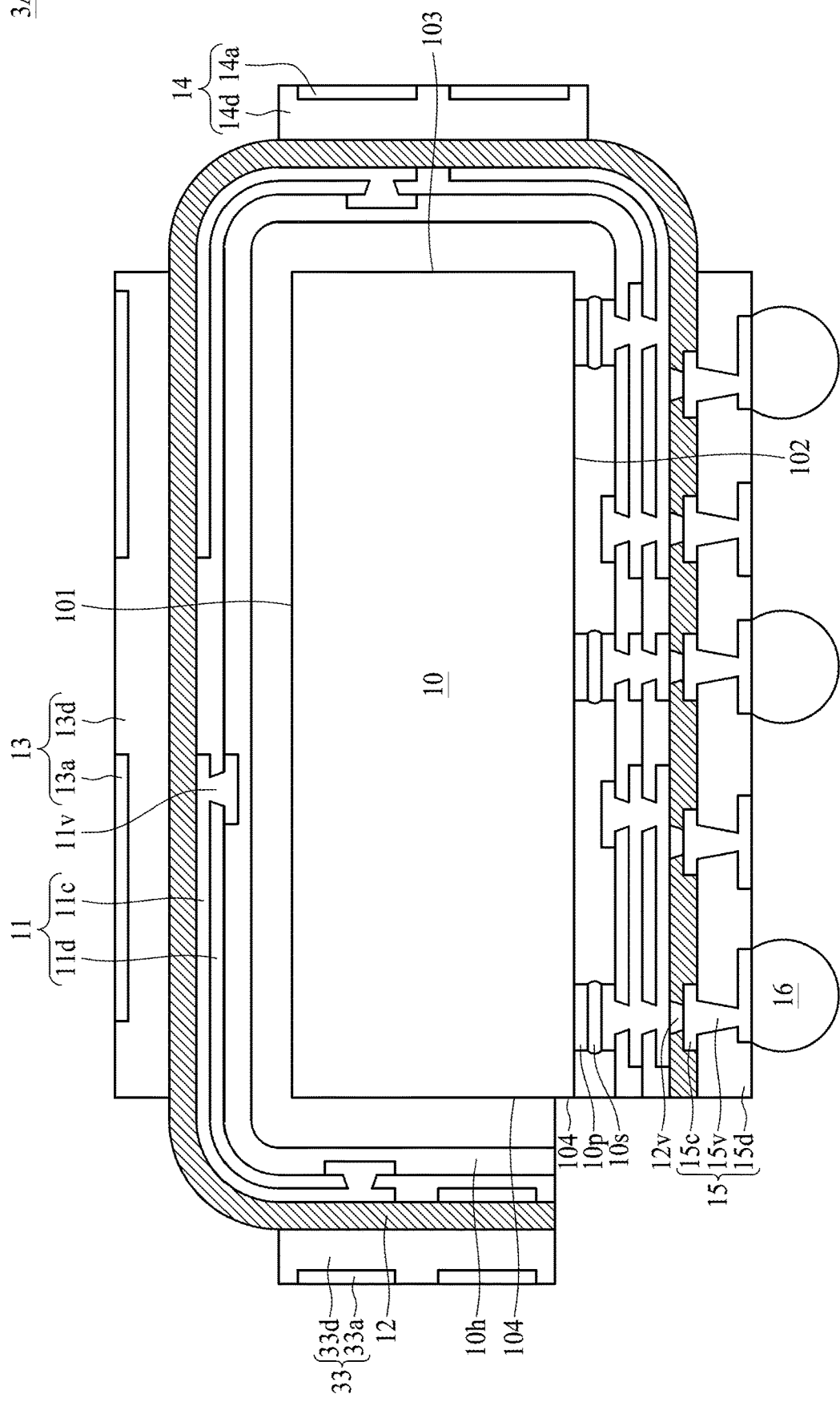
FIG. 3A illustrates a cross-sectional view of the part of a semiconductor device package, in accordance with some embodiments of the present disclosure.

FIG. 3A illustrates a cross-sectional view of a part of a semiconductor device package 3A, in accordance with some embodiments of the present disclosure. The semiconductor device package 3A is similar to the semiconductor device package 1 as shown in FIG. 1B, except that the semiconductor device package 3A further includes an antenna layer 33 disposed over a lateral surface 104 of the electronic component 10. For example, the semiconductor device package 3A has the antenna layer 13, the antenna layer 14 and the antenna layer 33 respectively disposed over the surface 101, the lateral surface 103 and the lateral surface 104. The antenna layer 33 includes an antenna pattern 33a and a dielectric layer 33d. The antenna layer 33 is the same as or similar to the antenna layer 13, and thus the descriptions of the antenna layer 13 can be applicable to the antenna layer 33.

Compared with the semiconductor device package 1, the semiconductor device package 3B has more radiation directions. For example, the semiconductor device package 3A is configured to radiate electromagnetic waves in three directions (e.g., a direction away from the surface 101 of the electronic component 10, a direction away from the lateral surface 103 of the electronic component 10, and a direction away from the lateral surface 104 of the electronic component 10). In some embodiments, the semiconductor device package 3B may include one or more antenna layers disposed over the lateral surfaces of the electronic component 10 between the lateral surface 103 and the lateral surface 104, so as to achieve more radiation directions.

Figure 3B:
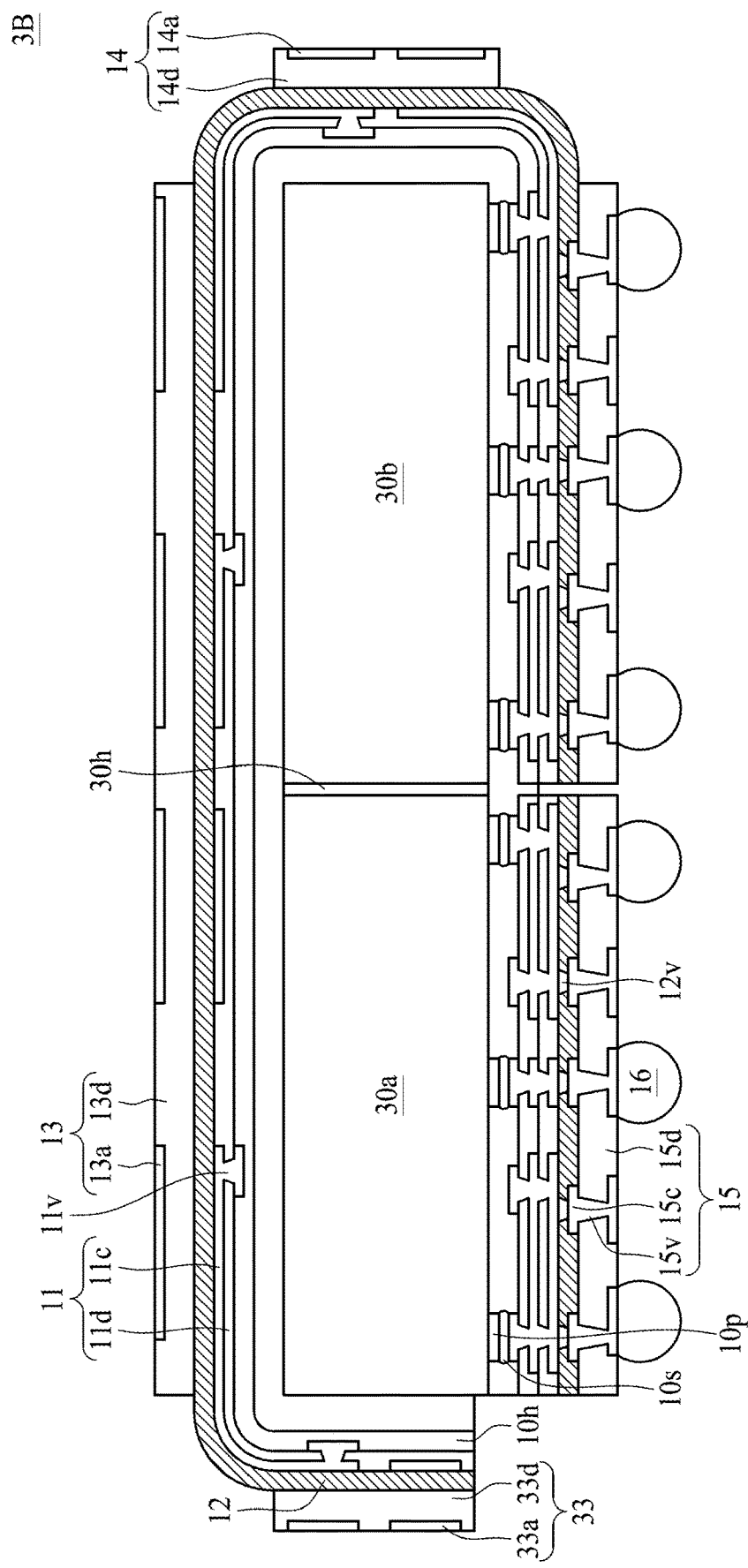
FIG. 3B illustrates a cross-sectional view of the part of a semiconductor device package, in accordance with some embodiments of the present disclosure.

FIG. 3B illustrates a cross-sectional view of a part of a semiconductor device package 3B, in accordance with some embodiments of the present disclosure. The semiconductor device package 3B is similar to the semiconductor device package 3A as shown in FIG. 3A, except that the semiconductor device package 3B includes multiple electronic components 30a and 30b surrounded by the antenna layers 13, 14 and 33. The electronic components 30a and 30b are disposed side-by-side. The electronic component 30a may be spaced apart from the electronic component 30b. The electronic component 30a may be connected to the electronic component 30b through an adhesive layer 30h (e.g., a tape or an attach film).

Figure 3C:
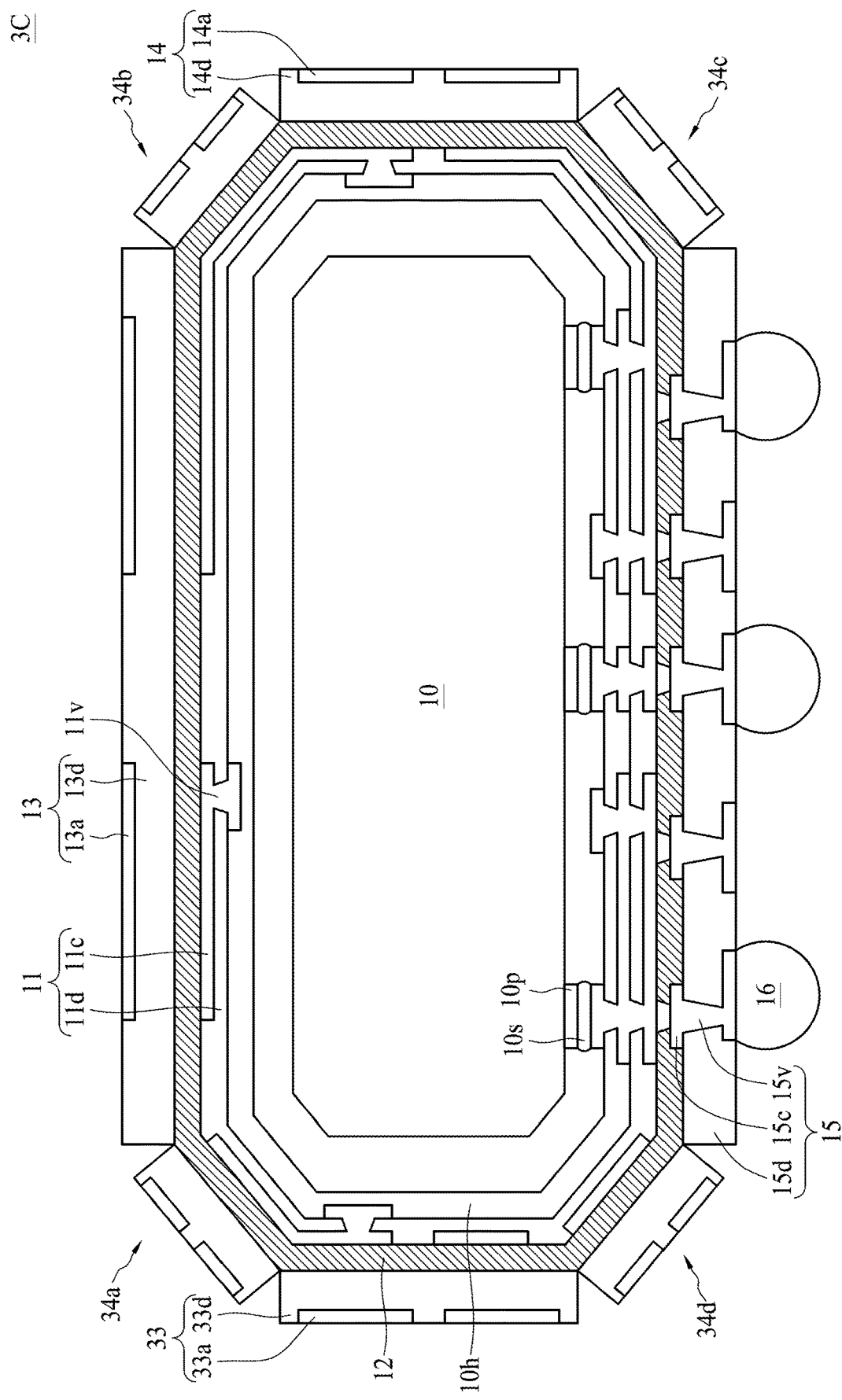
FIG. 3C illustrates a cross-sectional view of the part of a semiconductor device package, in accordance with some embodiments of the present disclosure.

FIG. 3C illustrates a cross-sectional view of a part of a semiconductor device package 3C, in accordance with some embodiments of the present disclosure. The semiconductor device package 3C is similar to the semiconductor device package 3A as shown in FIG. 3A, except that the electronic component 10 of the semiconductor device package 3C is polygonal and that the semiconductor device package 3C has antenna layers 34a, 34b, 34c, and 34d. The antenna layers 13, 14, 33, 34a, 34b, 34c, and 34d are disposed over the corresponding edges of the electronic component 10, so as to achieve more radiation directions. Each of the antenna layers 34a, 34b, 34c, and 34d is the same as or similar to the antenna layer 13, and thus the descriptions of the antenna layer 13 can be applicable to the antenna layers 34a, 34b, 34c, and 34d.

Figure 3D:
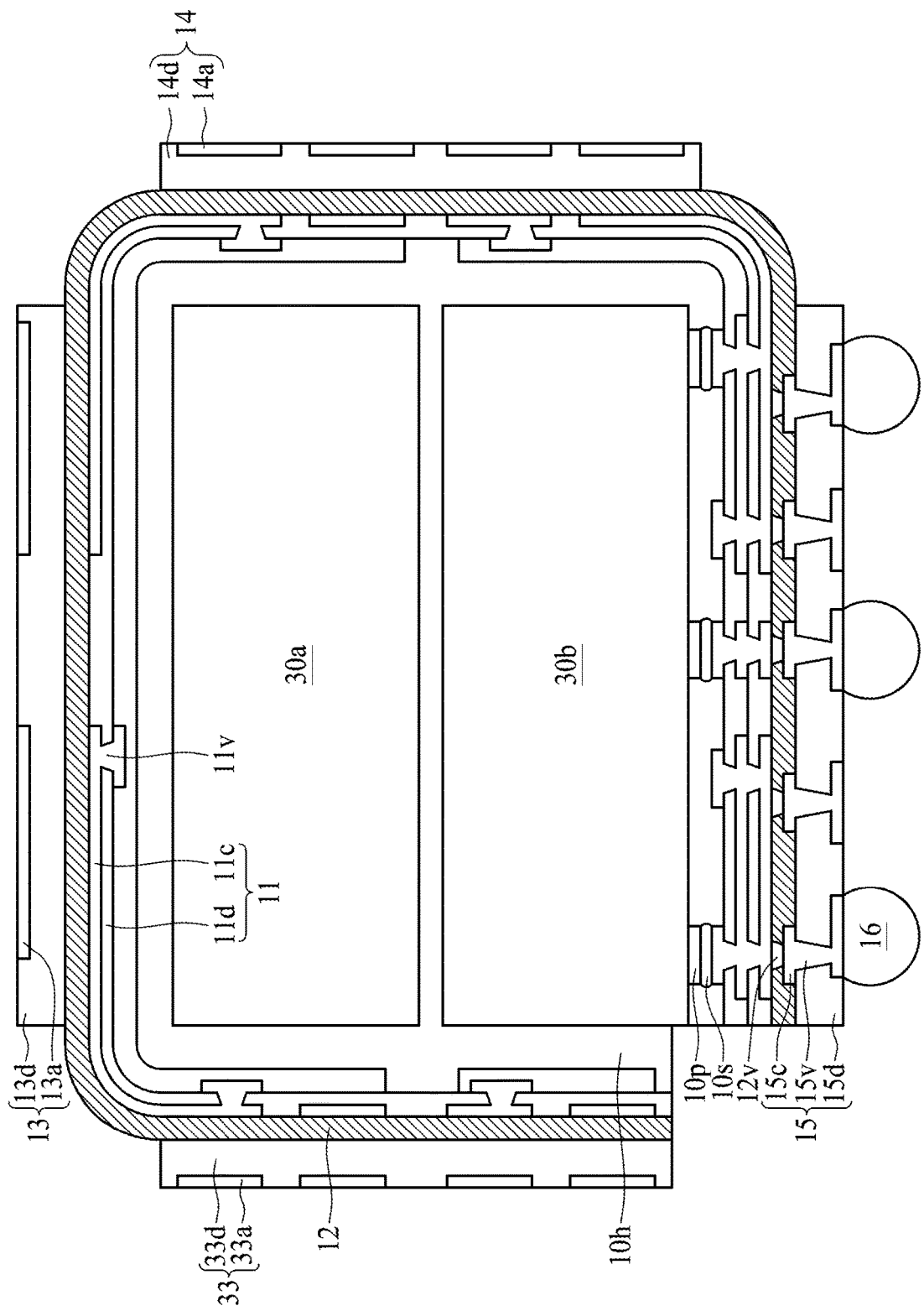
FIG. 3D illustrates a cross-sectional view of the part of a semiconductor device package, in accordance with some embodiments of the present disclosure.

FIG. 3D illustrates a cross-sectional view of a part of a semiconductor device package 3D, in accordance with some embodiments of the present disclosure. The semiconductor device package 3D is similar to the semiconductor device package 3A as shown in FIG. 3A, except that the semiconductor device package 3D includes multiple electronic components 30a and 30b surrounded by the antenna layers 13, 14 and 33. The electronic component 30a is disposed over the electronic component 30b. The electronic component 30a may be spaced apart from the electronic component 30b. The electronic component 30a may be connected to the electronic component 30b through the adhesive layer 10h. For example, the adhesive layer 10h is disposed between the electronic component 30a and the electronic component 30b.

Figure 3E:
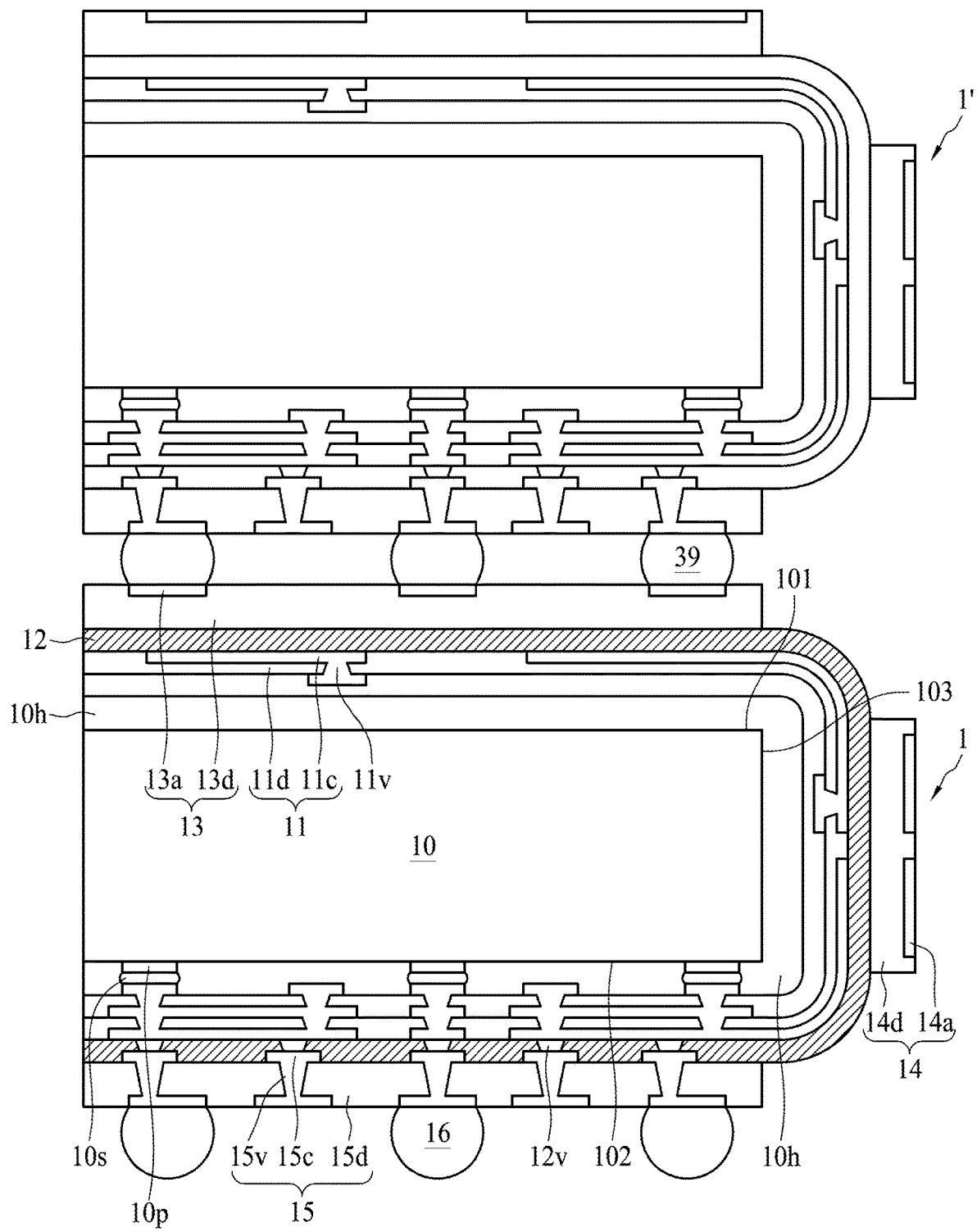
FIG. 3E illustrates a cross-sectional view of the part of a semiconductor device package, in accordance with some embodiments of the present disclosure.

FIG. 3E illustrates a cross-sectional view of a part of a semiconductor device package 3E, in accordance with some embodiments of the present disclosure. The semiconductor device package 3E includes the semiconductor device package 1 as shown in FIG. 1B and a semiconductor device package 1'. The semiconductor device package 1' is disposed over the semiconductor device package 1. The semiconductor device package 1' is electrically connected to the semiconductor device package 1 through the electrical contacts 39 (e.g., solder balls). The semiconductor device 1' is the same as or similar to the semiconductor device package 1, and thus the descriptions of the semiconductor device package 1 can be applicable to the semiconductor device package 1'. In some embodiments, the semiconductor device package 1' may be replaced by any of the semiconductor device packages 2A, 2B, 3A, 3B, 3C, and 3D.

Figure 4A:
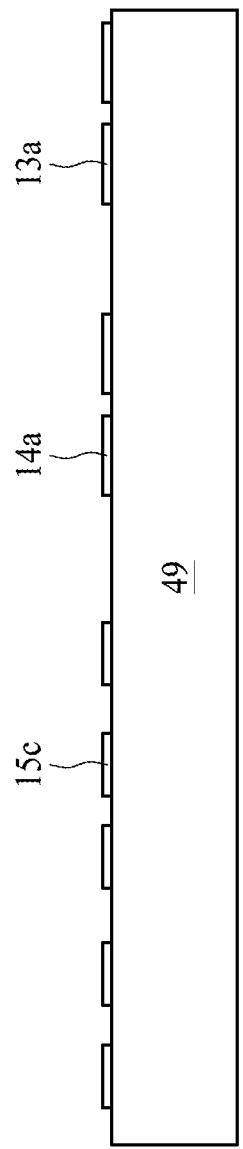
Figure 4B:
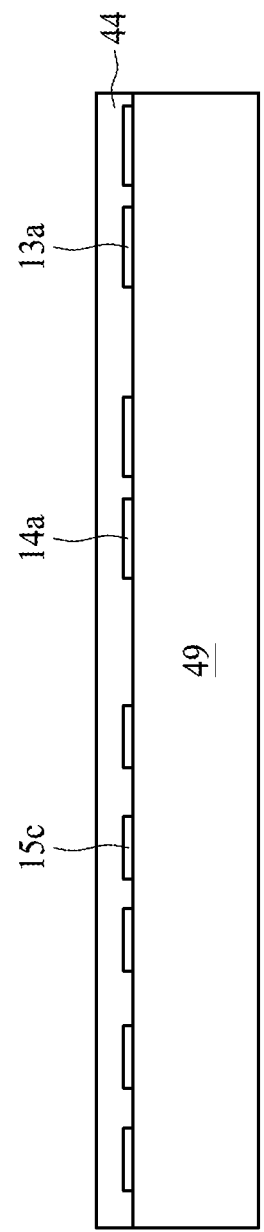
Figure 4E:
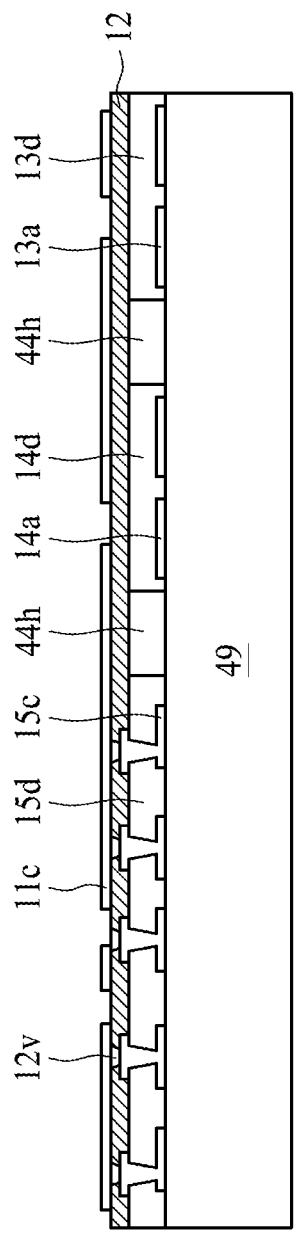
Figure 4E:
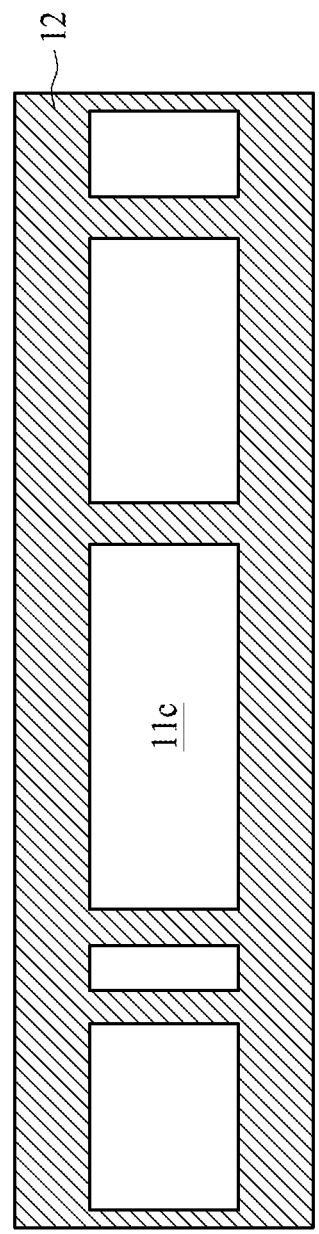
Figure 4F:
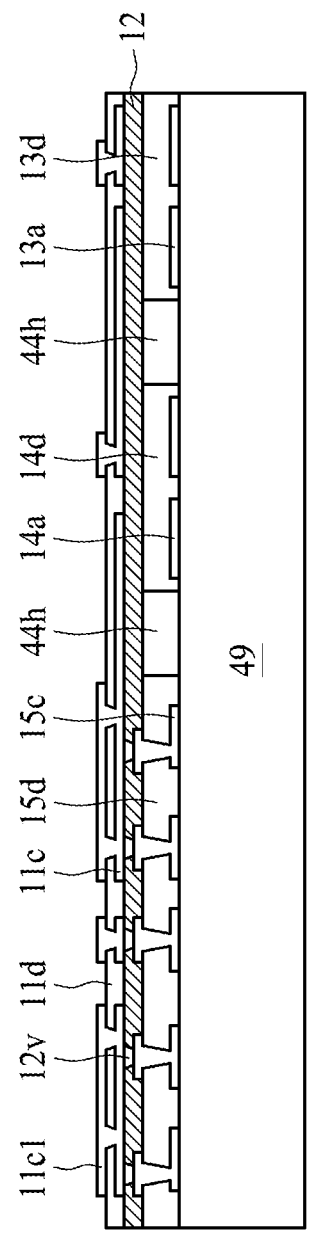
Figure 4F:
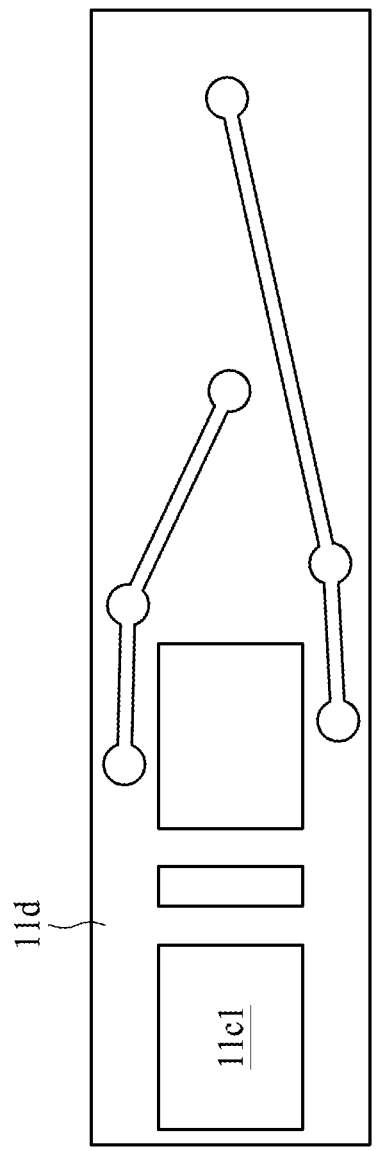
Figure 4G:
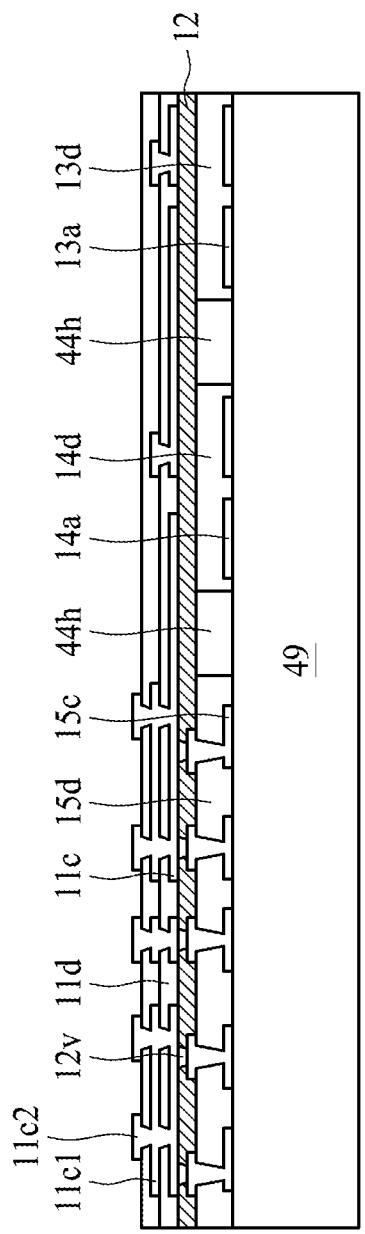
Figure 4G:
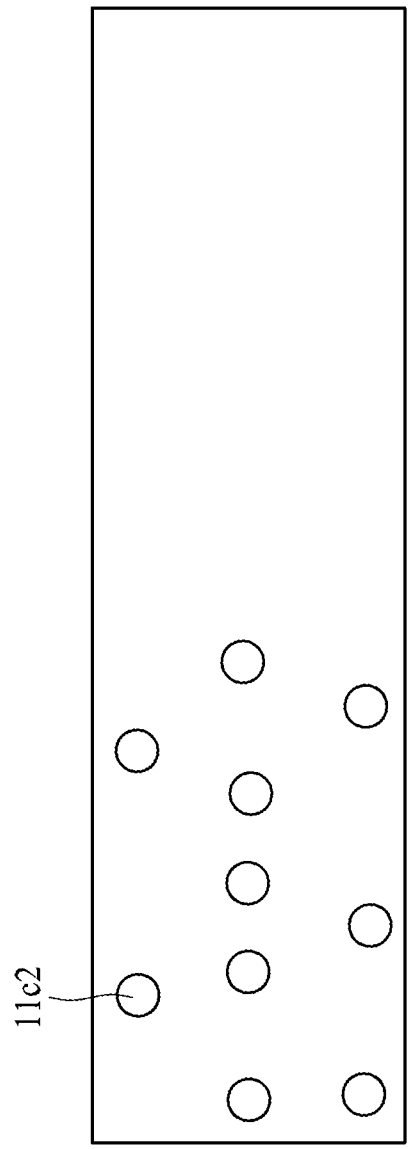

FIG. 4A, FIG. 4B, FIG. 4C, FIG. 4D, FIG. 4E, FIG. 4F, FIG. 4G, FIG. 4H, FIG. 4I, FIG. 4J, FIG. 4K, and FIG. 4L illustrate cross-sectional views of a semiconductor manufacturing method, in accordance with some embodiments of the present disclosure. FIG. 4E', FIG. 4F', and FIG. 4G' illustrate top views of the structures as shown in FIG. 4E, FIG. 4F, and FIG. 4G, respectively. In some embodiments, the method in FIG. 4A, FIG. 4B, FIG. 4C, FIG. 4D, FIG. 4E, FIG. 4F, FIG. 4G, FIG. 4H, FIG. 4I, FIG. 4J, FIG. 4K, and FIG. 4L can be used to manufacture the semiconductor device package 1 as shown in FIG. 1B.

Referring to FIG. 4A, a carrier 49 is provided. A patterned conductive layer including a conductive layer 15c, an antenna pattern 13a, and an antenna pattern 14b are formed on the carrier 49.

Referring to FIG. 4B, a dielectric layer 44 is formed on the carrier 49 to cover the patterned conductive layer including the conductive layer 15c, the antenna pattern 13a, and the antenna pattern 14a. In some embodiments, the dielectric layer 44 may be formed by, for example, lamination and lithographic techniques.

Referring to FIG. 4C, one or more openings (recesses or cavities) 44h are formed to penetrate the dielectric layer 44 to form dielectric layers 13d, 14d, and 15d, which are spaced apart from each other.

Referring to FIG. 4D, a dielectric layer 12 (e.g., a dry film) is formed on the dielectric layers 13d, 14d, and 15d. In some embodiments, the dielectric layer 12 may be formed by, for example, lamination and lithographic techniques.

Referring to FIG. 4E and FIG. 4E', a patterned conductive layer (e.g., a conductive layer 11c) is formed on the dielectric layer 12. Conductive vias 12v may be formed to penetrate the dielectric layer 12 to electrically connect the conductive layer 11c with the conductive layer 15c.

Referring to FIG. 4F, FIG. 4F', FIG. 4G, and FIG. 4G', one or more dielectric layers 11d are formed on the dielectric layer 12 to cover the conductive layer 11c. Patterned conductive layers 11c1, 11c2 are then formed on the dielectric layer 11d and electrically connected to the conductive layer 11c through conductive vias.

Figure 4H:
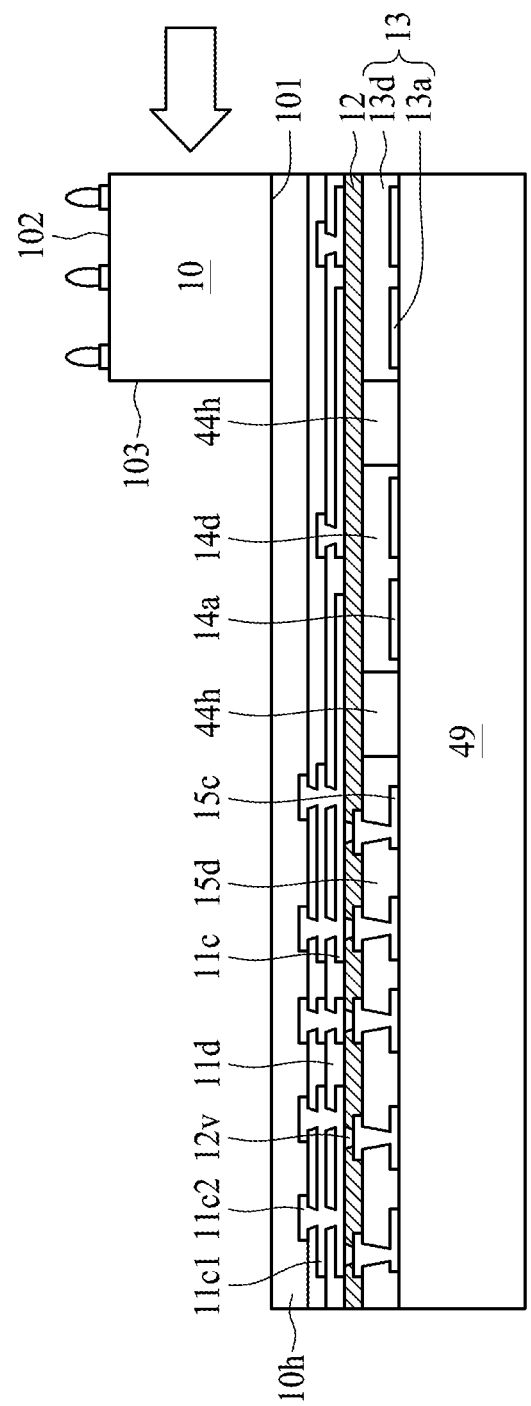

Referring to FIG. 4H, an adhesive layer 10h (e.g., a tape or an adhesive film) is disposed on the circuit layer an electronic component 10 is disposed on the dielectric layer 11d. An electronic component 10 is disposed on the adhesive layer 10h. The electronic component 10 has a surface 101 (e.g., a backside surface) connected to the adhesive layer 10h. The electronic component 10 is disposed over an antenna layer 13 including the antenna pattern 13a and the dielectric layer 13d. A force is then applied to the lateral surface of the electronic component 10 to achieve the first rotation.

Figure 4I:
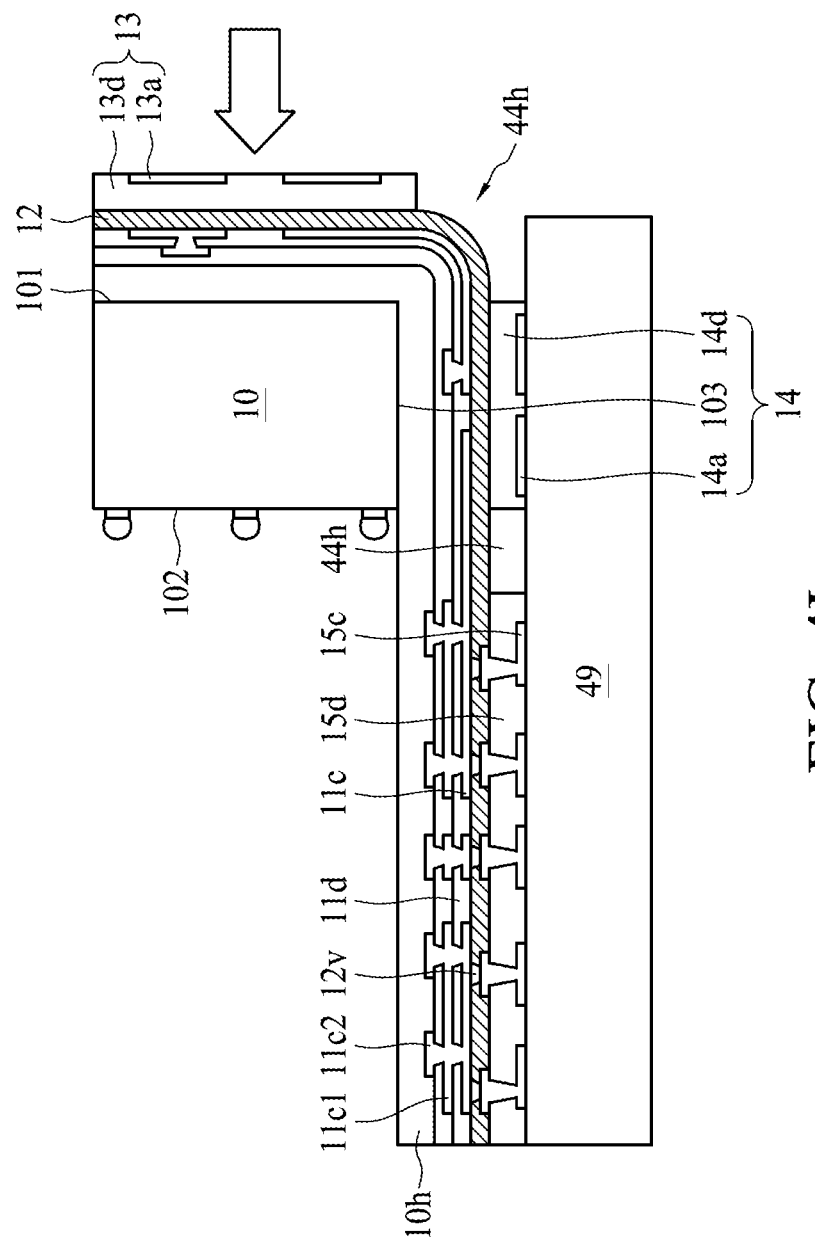

Referring to FIG. 4I, after the first rotation, the surface 101 of the electronic component 10 is substantially perpendicular to a top surface of the carrier 49, and a lateral surface 103 of the electronic component 10 facing the top surface of the carrier 49 is connected to the adhesive layer 10h. The lateral surface 103 of the electronic component 10 is disposed over an antenna layer 14 including the antenna pattern 14a and the dielectric layer 14d. As shown in FIG. 4I, the opening 44h is located at the corner of the electronic component 10. The force is applied to an antenna layer 13 to achieve the second rotation.

Figure 4J:
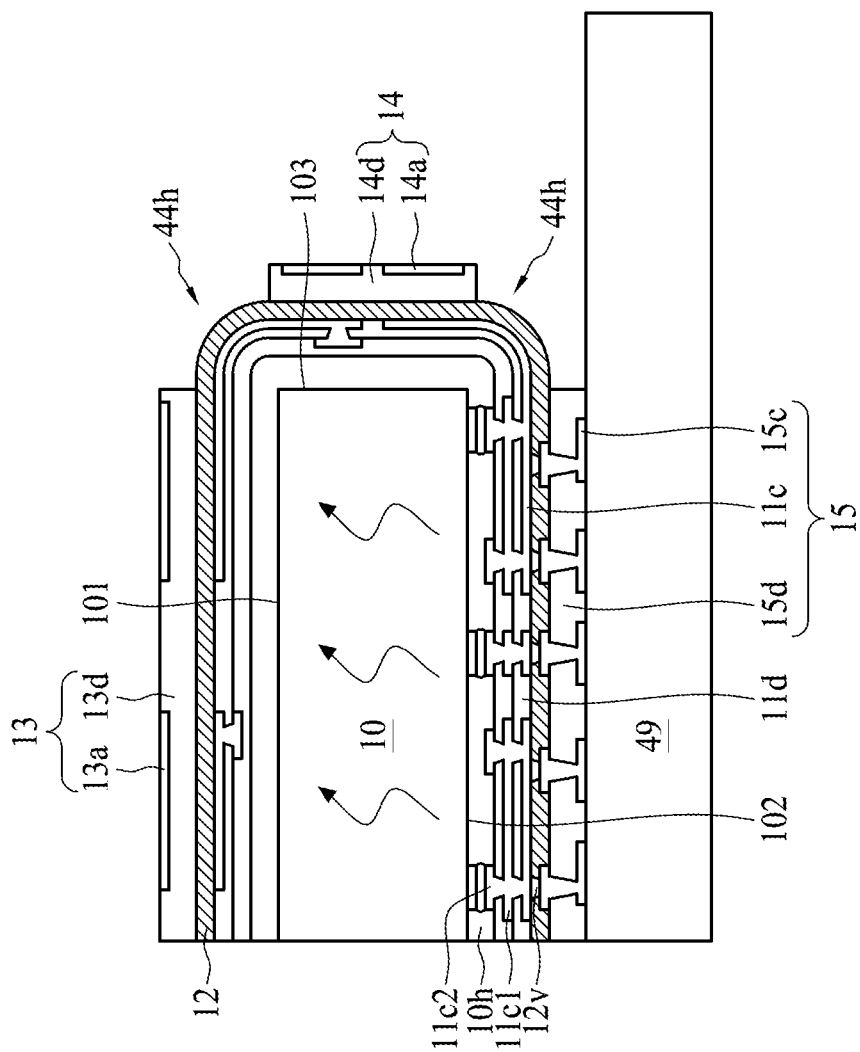

Referring to FIG. 4J, after the second rotation, the surface 101 of the electronic component 10 faces away from the top surface of the carrier 49, the lateral surface 103 of the electronic component 10 is substantially perpendicular to the top surface of the carrier 49, and a surface 102 (e.g., an active surface) of the electronic component 10 is connected to the adhesive layer 10h. The surface 102 of the electronic component 10 is disposed over a circuit layer 15 including the conductive layer 15c and the dielectric layer 15d. A heat can be then applied to the structure as shown in FIG. 4J to cure the adhesive layer 10h (e.g., a reflow operation).

Figure 4K:
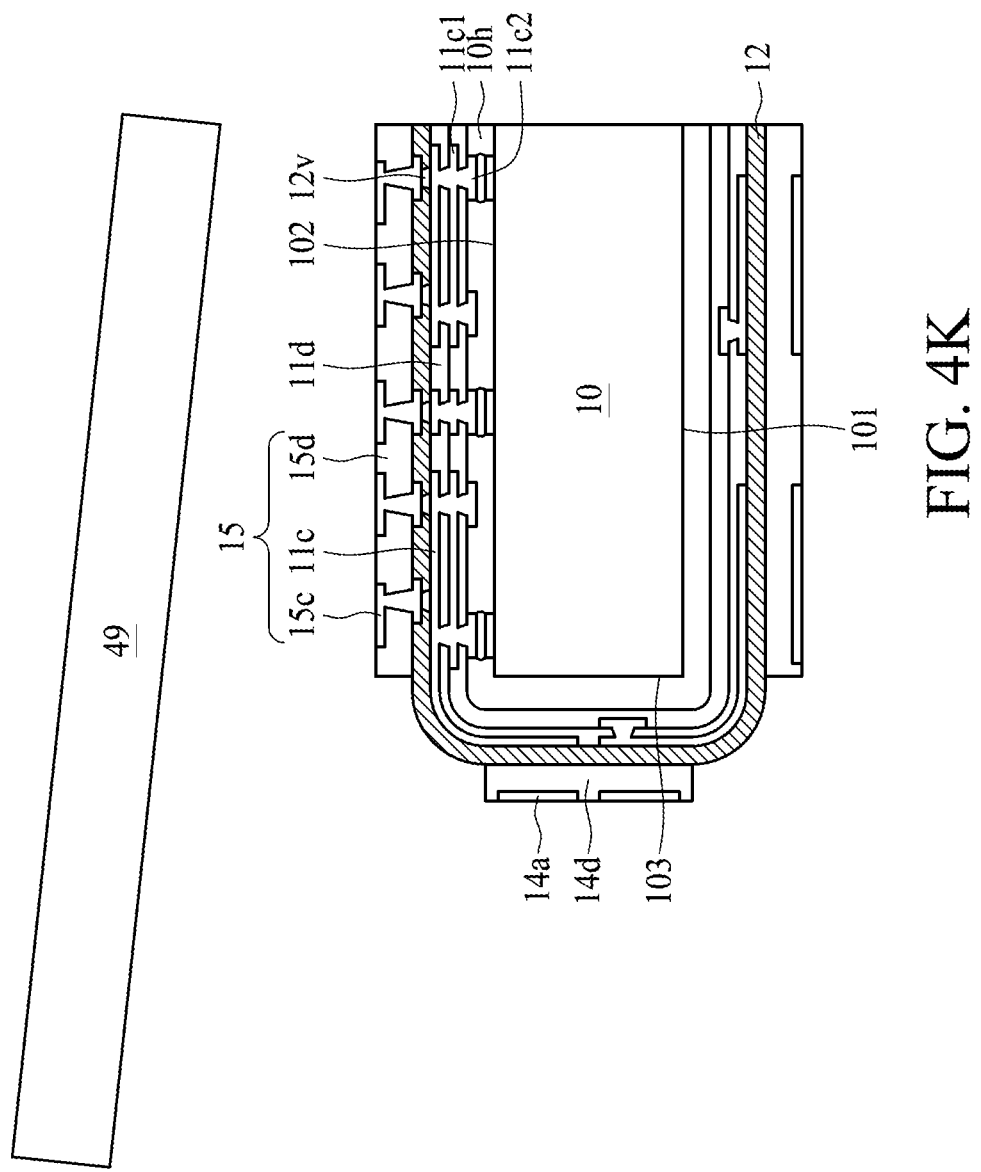
Figure 4L:
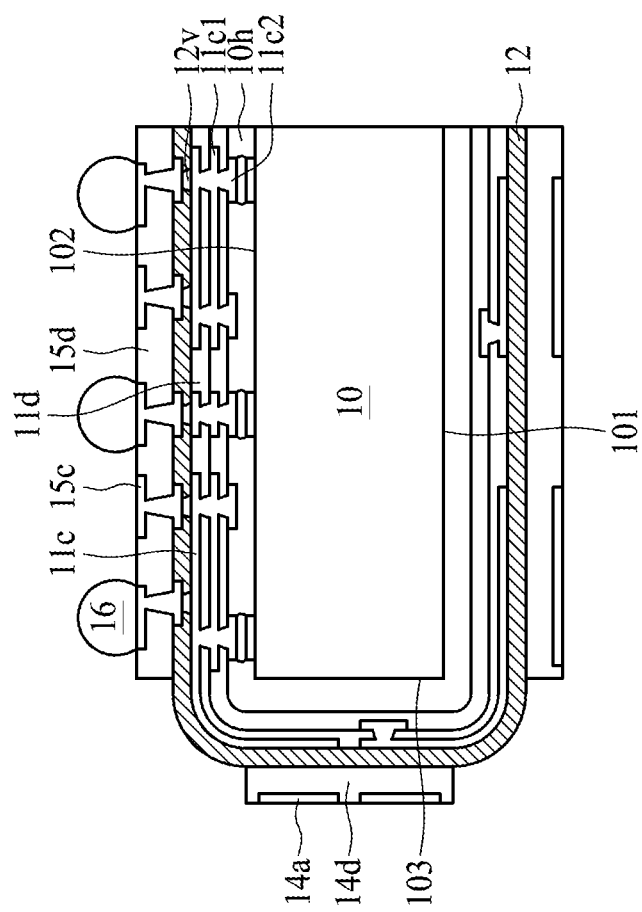

Referring to FIG. 4K, the carrier 49 is removed to expose a portion of the circuit layer 15 (e.g., the conductive layer 15c). Electrical contacts 16 are formed on the exposed portion of the conductive layer 15c as shown in FIG. 4L. In some embodiments, singulation may be performed to the structure as shown in FIG. 4L.

In the embodiments as shown in FIG. 4A, FIG. 4B, FIG. 4C, FIG. 4D, FIG. 4E, FIG. 4F, FIG. 4G, FIG. 4H, FIG. 4I, FIG. 4J, FIG. 4K, and FIG. 4L, the substrate (e.g., the structure as shown in FIG. 4G) is formed, and the electronic component 10 is connected to the substrate. In other words, the substrate can be tested to ensure it functions well, and then the electronic component is connected to the well-functioning substrate. This can increase the yield rate.

Figure 5A:
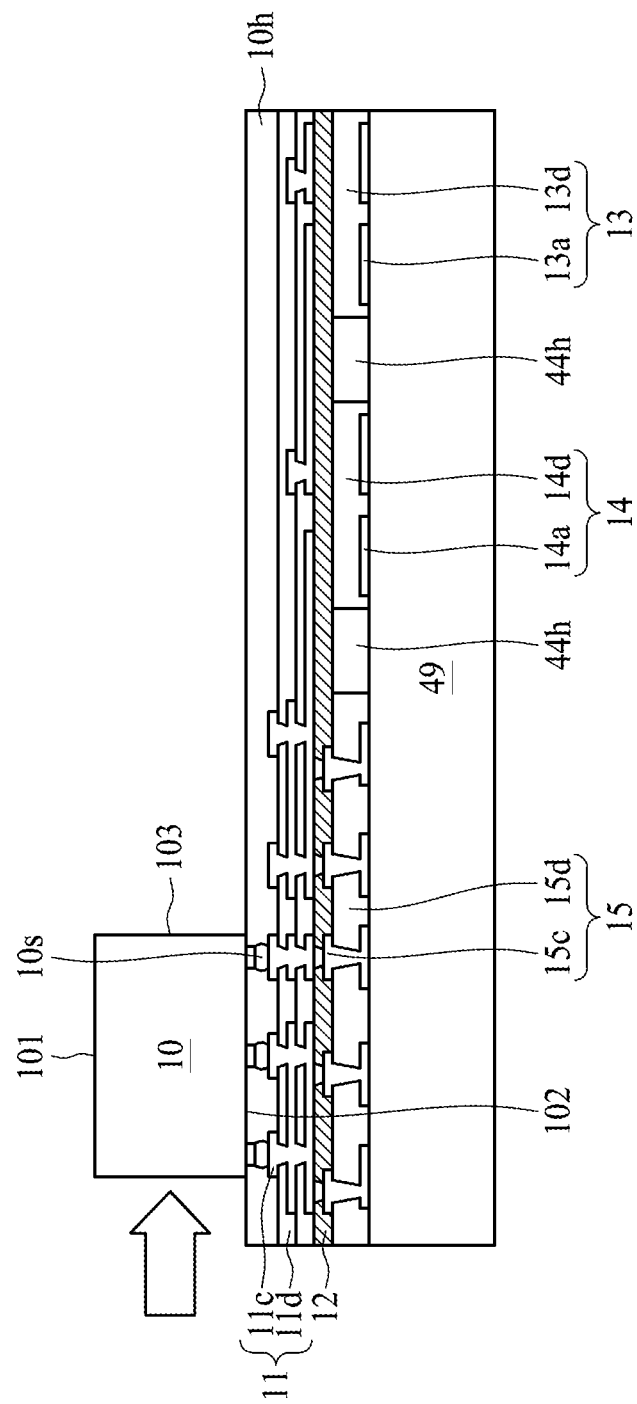
FIG. 5A, FIG. 5B, FIG. 5C, FIG. 5D, and FIG. 5E illustrate cross-sectional views of a semiconductor manufacturing method, in accordance with some embodiments of the present disclosure.

FIG. 5A, FIG. 5B, FIG. 5C, FIG. 5D, and FIG. 5E illustrate cross-sectional views of a semiconductor manufacturing method, in accordance with some embodiments of the present disclosure. In some embodiments, the operation as shown in FIG. 5A is carried out after the operation as shown in FIG. 4G.

Referring to FIG. 5A, an adhesive layer 10h is formed on the circuit layer 11. An electronic component 10 is disposed on the adhesive layer 10h. For example, the electronic component 10 has a surface 102 (e.g., an active surface) connected to the adhesive layer 10h. Electrical contacts 10s electrically connected to the surface 102 of the electronic component 10 penetrate the adhesive layer 10h to contact the conductive layer 10c of the circuit layer 10. The surface 102 of the electronic component 10 is disposed over the circuit layer 15. A force is then applied to the lateral surface of the electronic component 10 to achieve the first rotation.

Figure 5B:
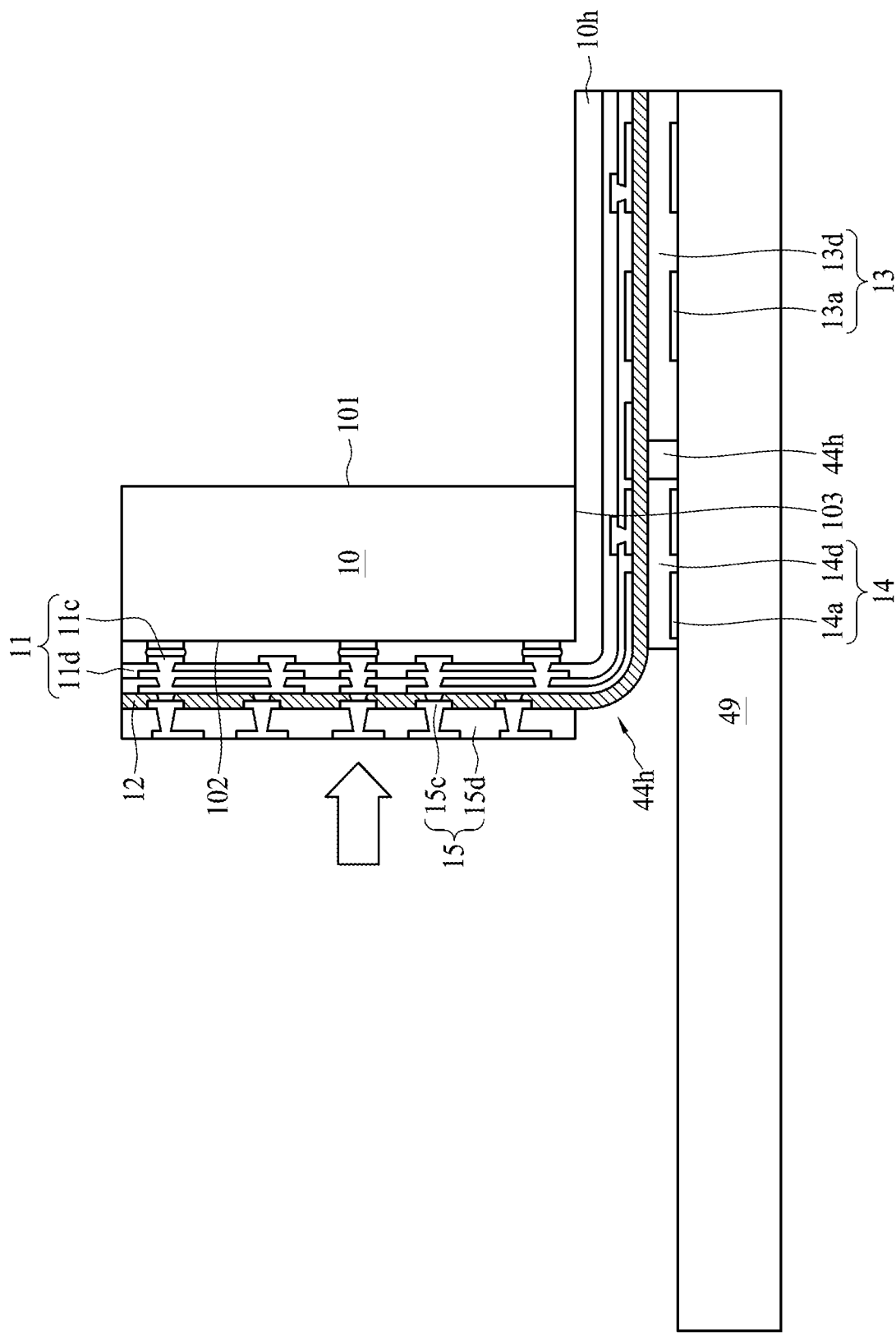

Referring to FIG. 5B, after the first rotation, the surface 102 of the electronic component 10 is substantially perpendicular to the top surface of the carrier 49, and a lateral surface 103 of the electronic component 10 facing the top surface of the carrier 49 is connected to the adhesive layer 10h. The lateral surface 103 of the electronic component 10 is disposed over an antenna layer 14 including the antenna pattern 14a and the dielectric layer 14d. As shown in FIG. 5B, the opening 44h is located at the corner of the electronic component 10. The force is applied to the circuit layer 15 to achieve the second rotation.

Figure 5C:
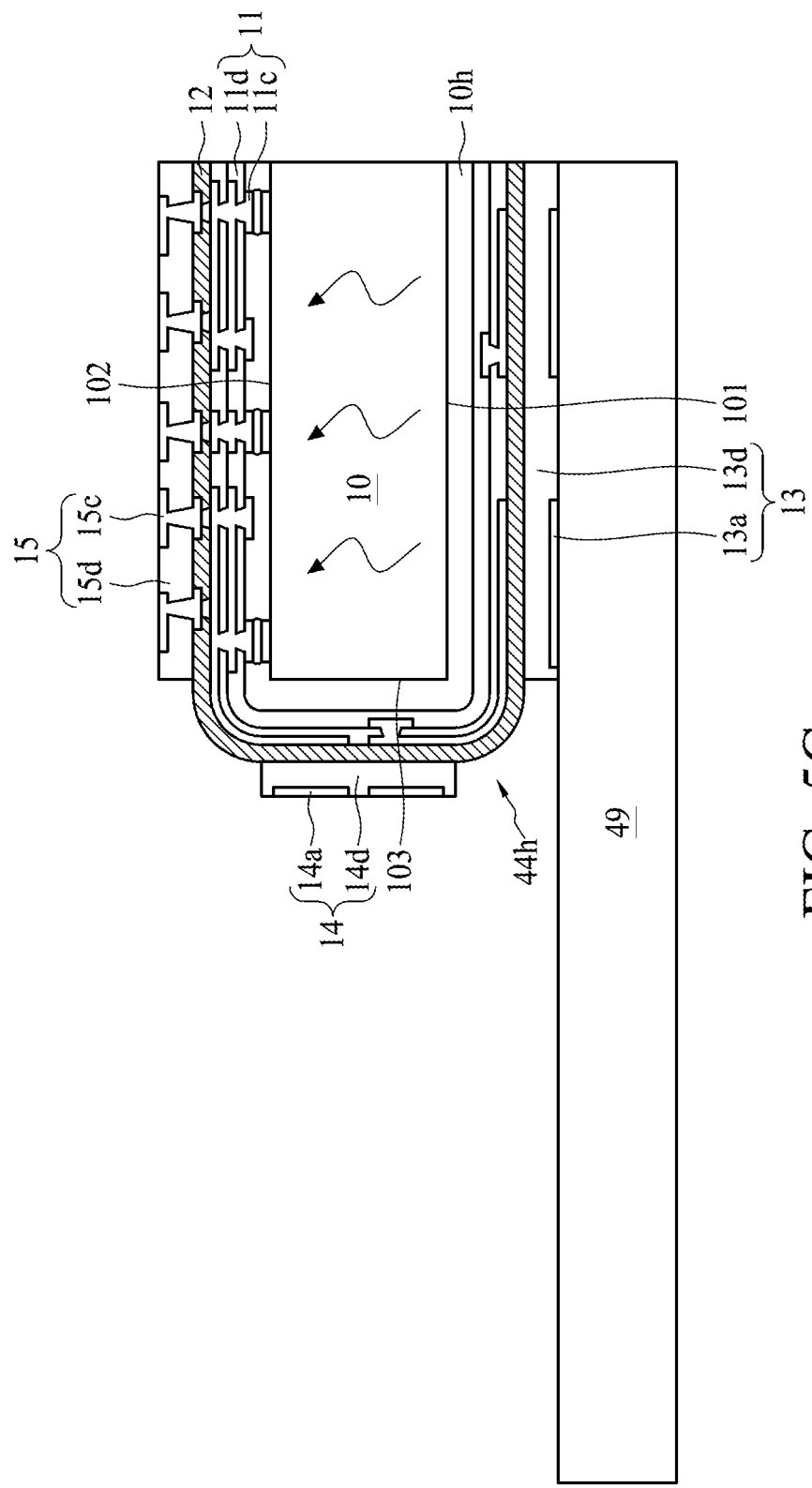

Referring to FIG. 5C, after the second rotation, the surface 102 of the electronic component 10 faces away from the top surface of the carrier 49, the lateral surface 103 of the electronic component 10 is substantially perpendicular to the top surface of the carrier 49, and a surface 101 (e.g., a backside surface surface) of the electronic component 10 is connected to the adhesive layer 10h. The surface 101 of the electronic component 10 is disposed over the antennal layer 13 including the antenna pattern 13a and the dielectric layer 13d. A heat can be then applied to the structure as shown in FIG. 5C to cure the adhesive layer 10h (e.g., a reflow operation).

Figure 5D:
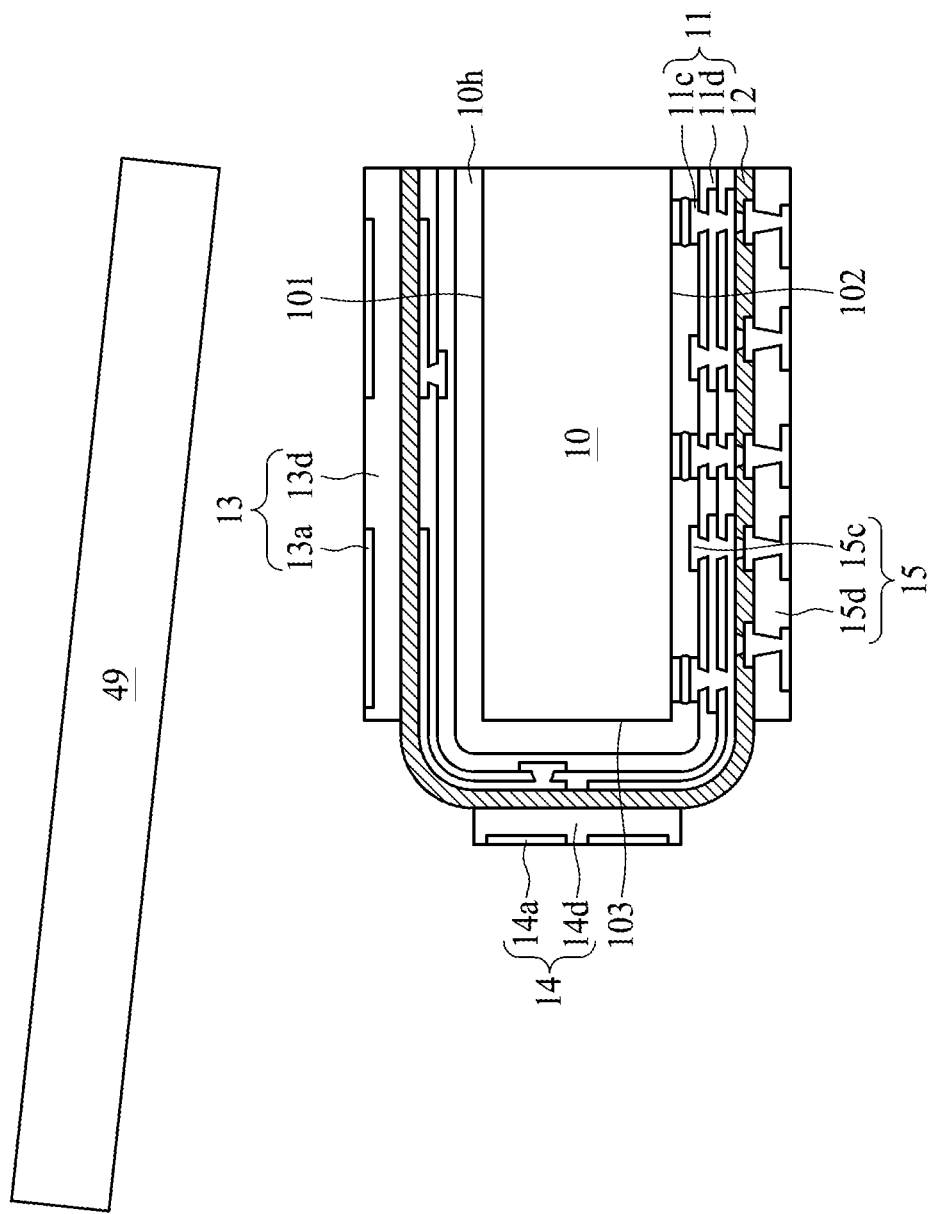
Figure 5E:
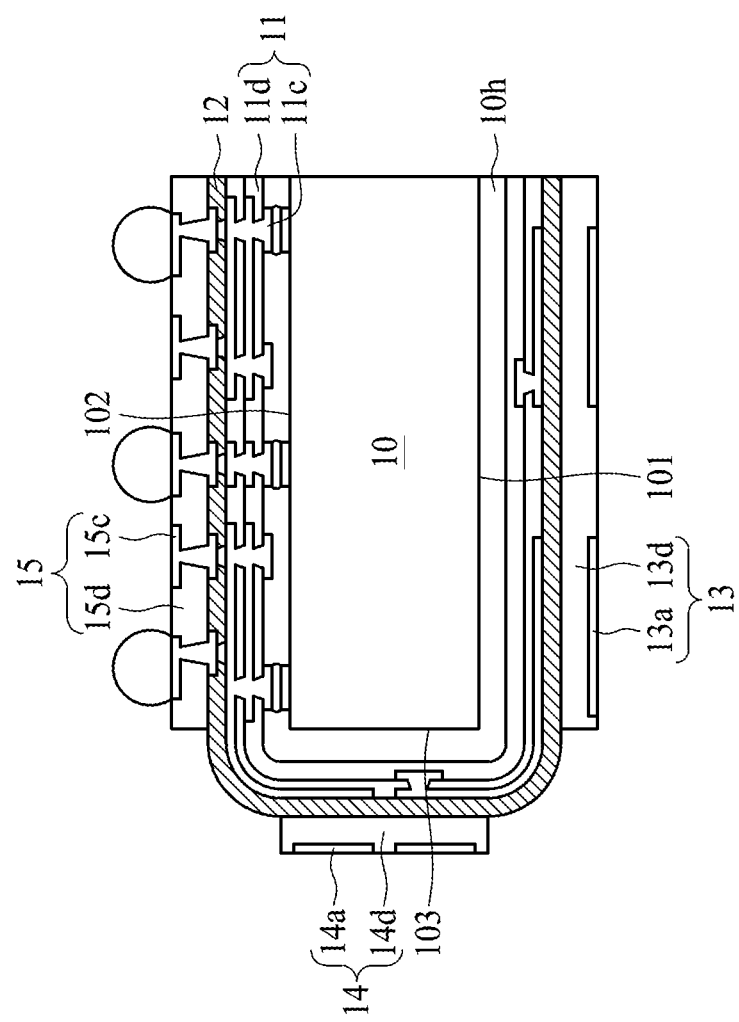

Referring to FIG. 5D, the carrier 49 is removed to expose the antenna layer 13. Electrical contacts 16 are formed on the conductive layer 15c of the circuit layer 15 as shown in FIG. 5E. In some embodiments, singulation may be performed to the structure as shown in FIG. 5E.

Figure 6A:
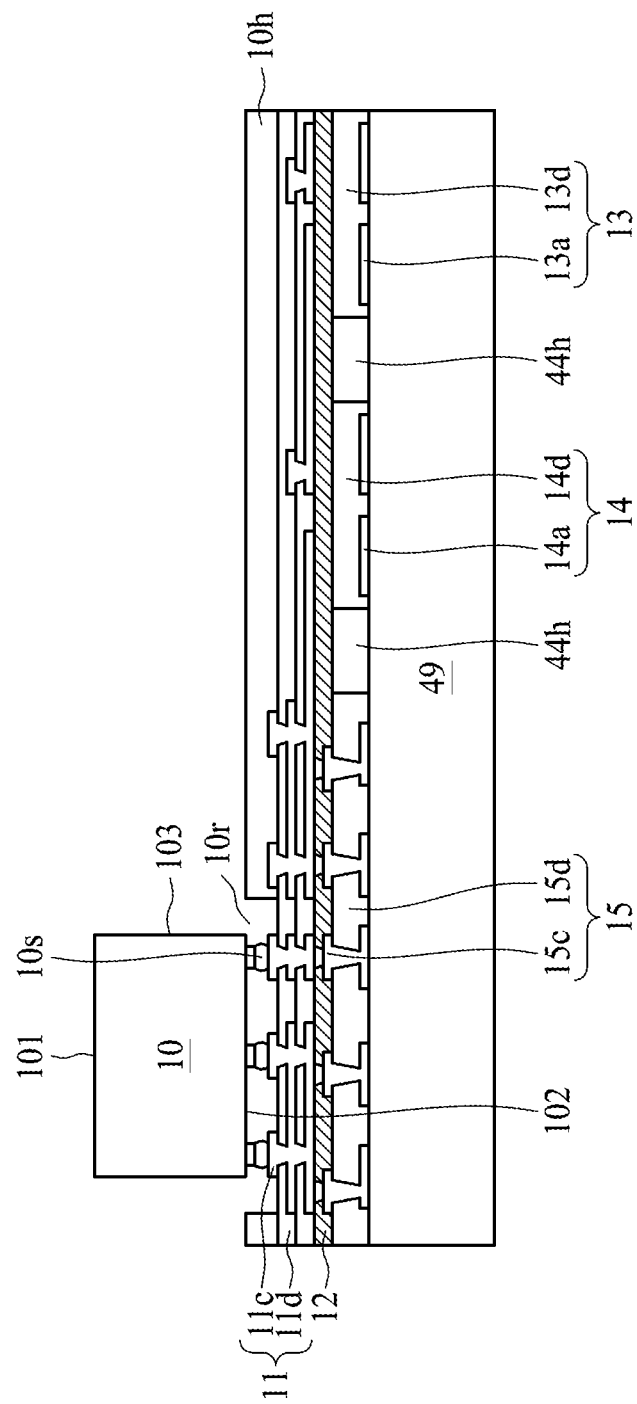
FIG. 6A, FIG. 6B, FIG. 6C, FIG. 6D, FIG. 6E, and FIG. 6F illustrate cross-sectional views of a semiconductor manufacturing method, in accordance with some embodiments of the present disclosure.

FIG. 6A, FIG. 6B, FIG. 6C, FIG. 6D, FIG. 6E, and FIG. 6F illustrate cross-sectional views of a semiconductor manufacturing method, in accordance with some embodiments of the present disclosure. In some embodiments, the operation as shown in FIG. 6A is carried out after the operation as shown in FIG. 4G.

Referring to FIG. 6A, an adhesive layer 10h is formed on the circuit layer 11. The adhesive layer 10h defines an opening 10r to expose a portion of the circuit layer 11. An electronic component 10 is disposed on the exposed portion of the circuit layer 11. The electronic component 11 is electrically connected to the circuit layer 11 through the electrical contacts 10s. The electronic component 11 is disposed over the circuit layer 15.

Figure 6B:
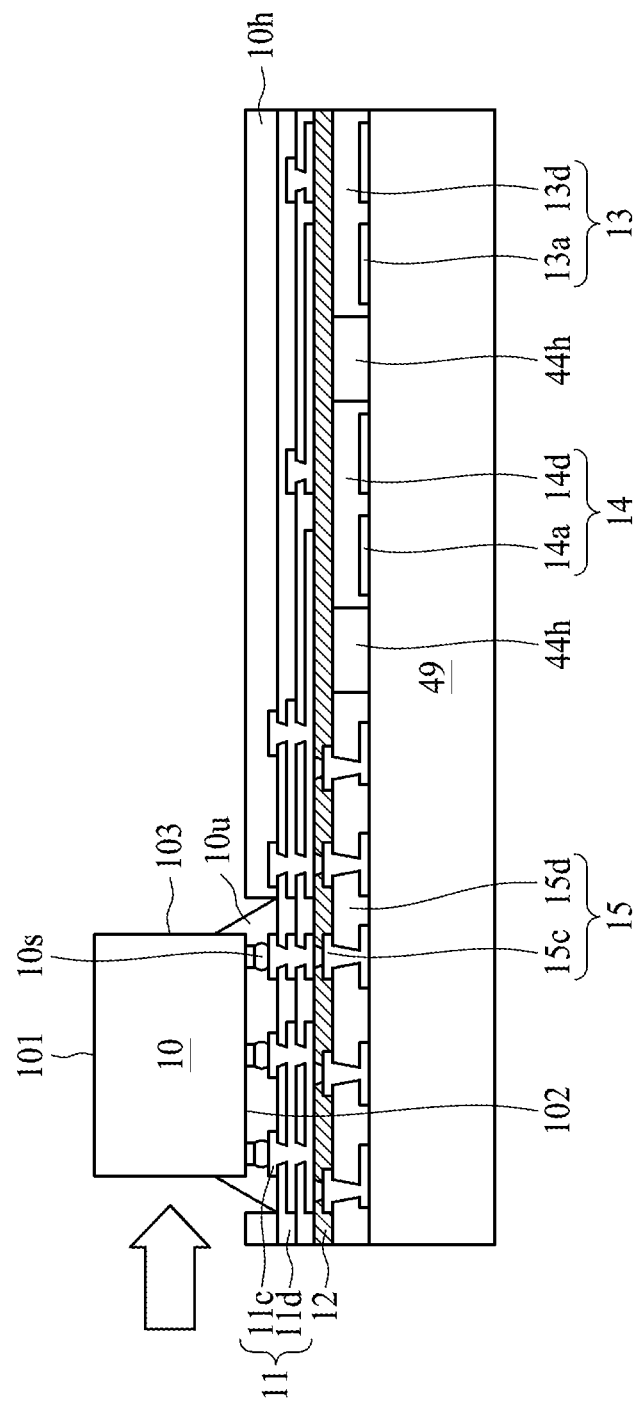

Referring to FIG. 6B, an underfill 10u is formed within the opening 10r. The underfill 10u covers the electrical contacts 10s. A heat may be then applied to the structure as shown in FIG. 6B to cure the underfill 10u (e.g., a reflow operation). A force is then applied to the lateral surface of the electronic component 10 to achieve the first rotation.

Figure 6C:
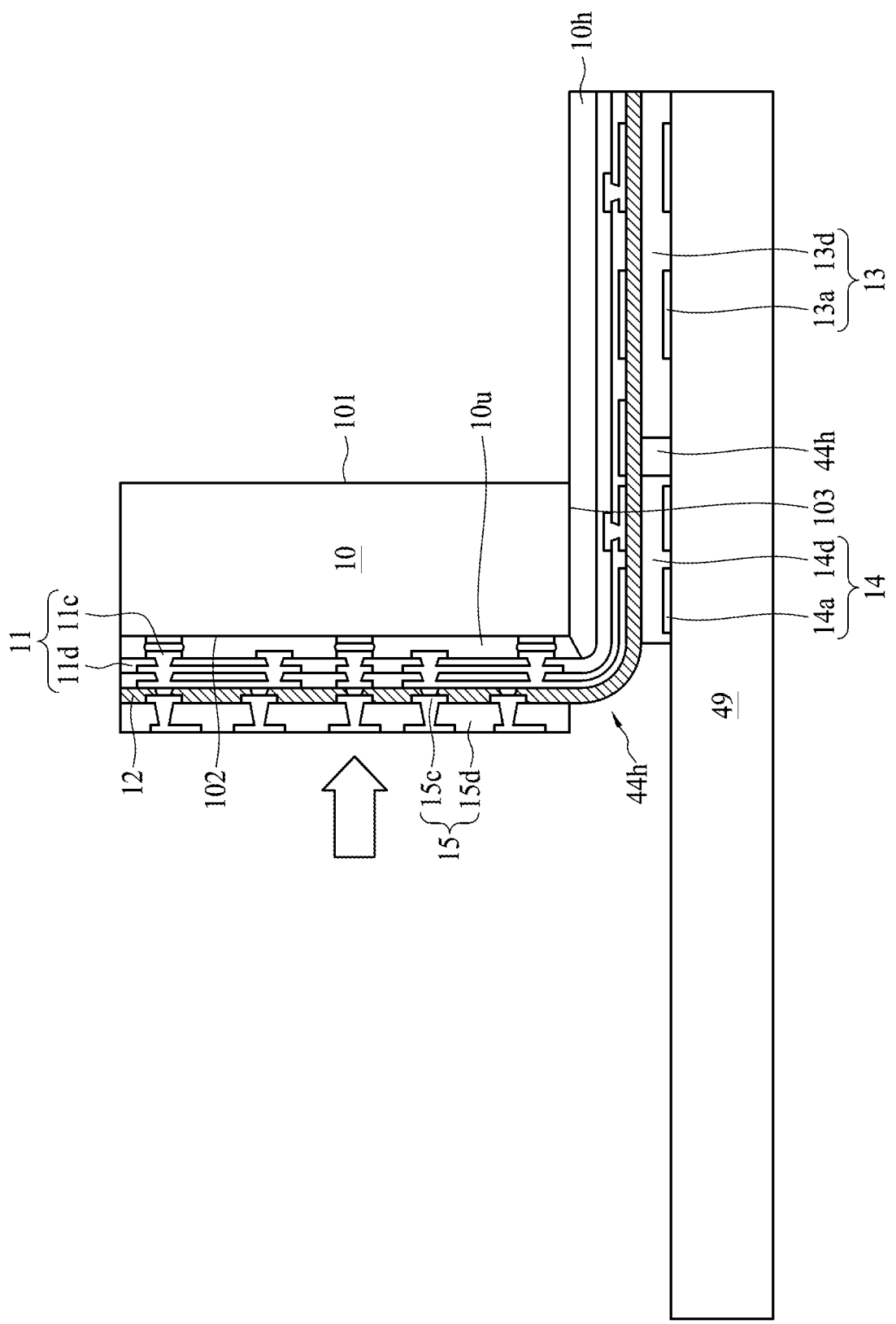

Referring to FIG. 6C, after the first rotation, the surface 102 of the electronic component 10 is substantially perpendicular to the top surface of the carrier 49, and a lateral surface 103 of the electronic component 10 facing the top surface of the carrier 49 is connected to the adhesive layer 10h. The lateral surface 103 of the electronic component 10 is disposed over an antenna layer 14 including the antenna pattern 14a and the dielectric layer 14d. As shown in FIG. 6C, the opening 44h is located at the corner of the electronic component 10. The force is applied to the circuit layer 15 to achieve the second rotation.

Figure 6D:
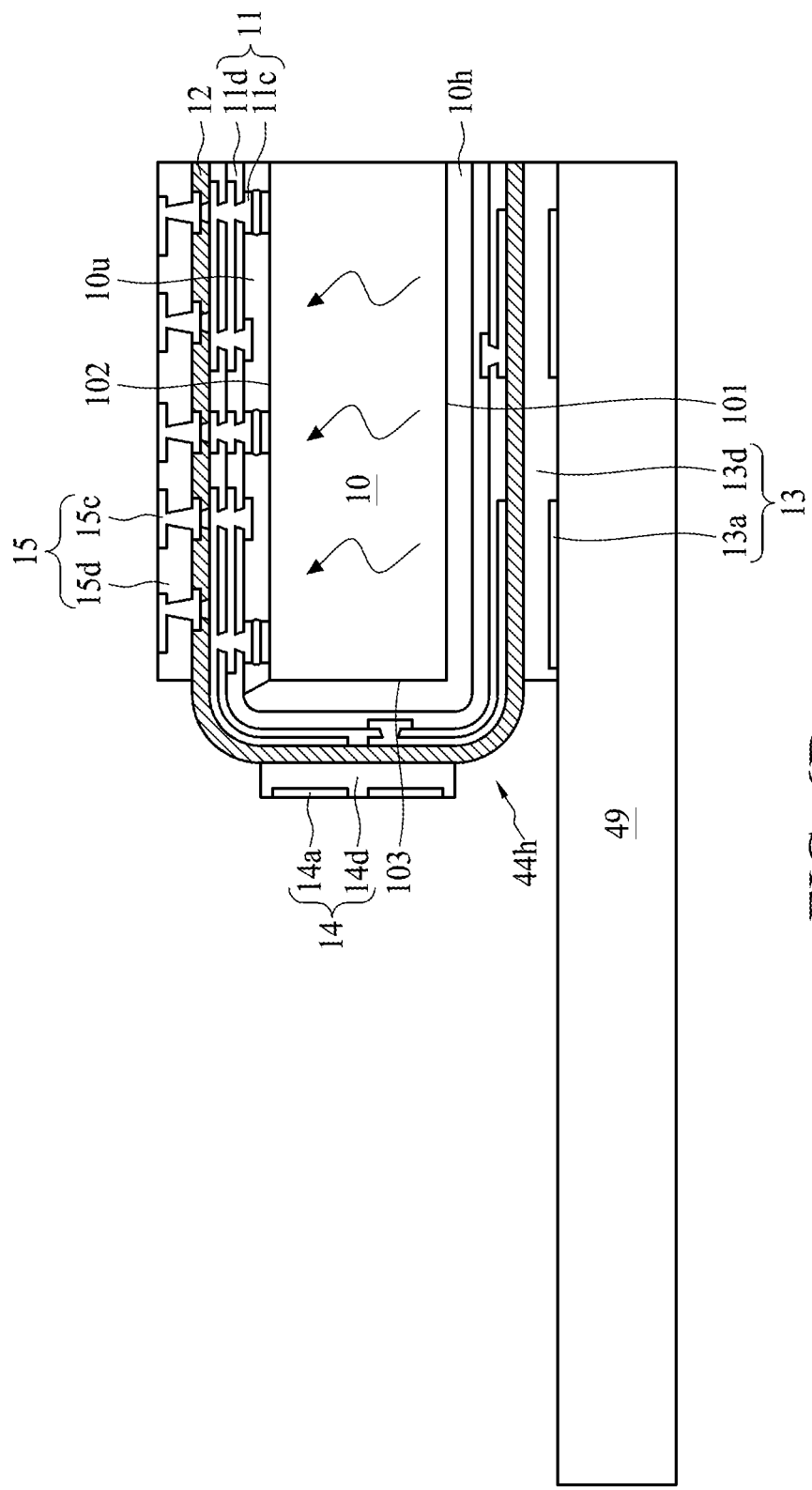

Referring to FIG. 6D, after the second rotation, the surface 102 of the electronic component 10 faces away from the top surface of the carrier 49, the lateral surface 103 of the electronic component 10 is substantially perpendicular to the top surface of the carrier 49, and a surface 101 (e.g., a backside surface surface) of the electronic component 10 is connected to the adhesive layer 10h. The surface 101 of the electronic component 10 is disposed over the antennal layer 13 including the antenna pattern 13a and the dielectric layer 13d. A heat can be then applied to the structure as shown in FIG. 6D to cure the adhesive layer 10h (e.g., a reflow operation or an ultraviolet (UV) curing operation).

Figure 6E:
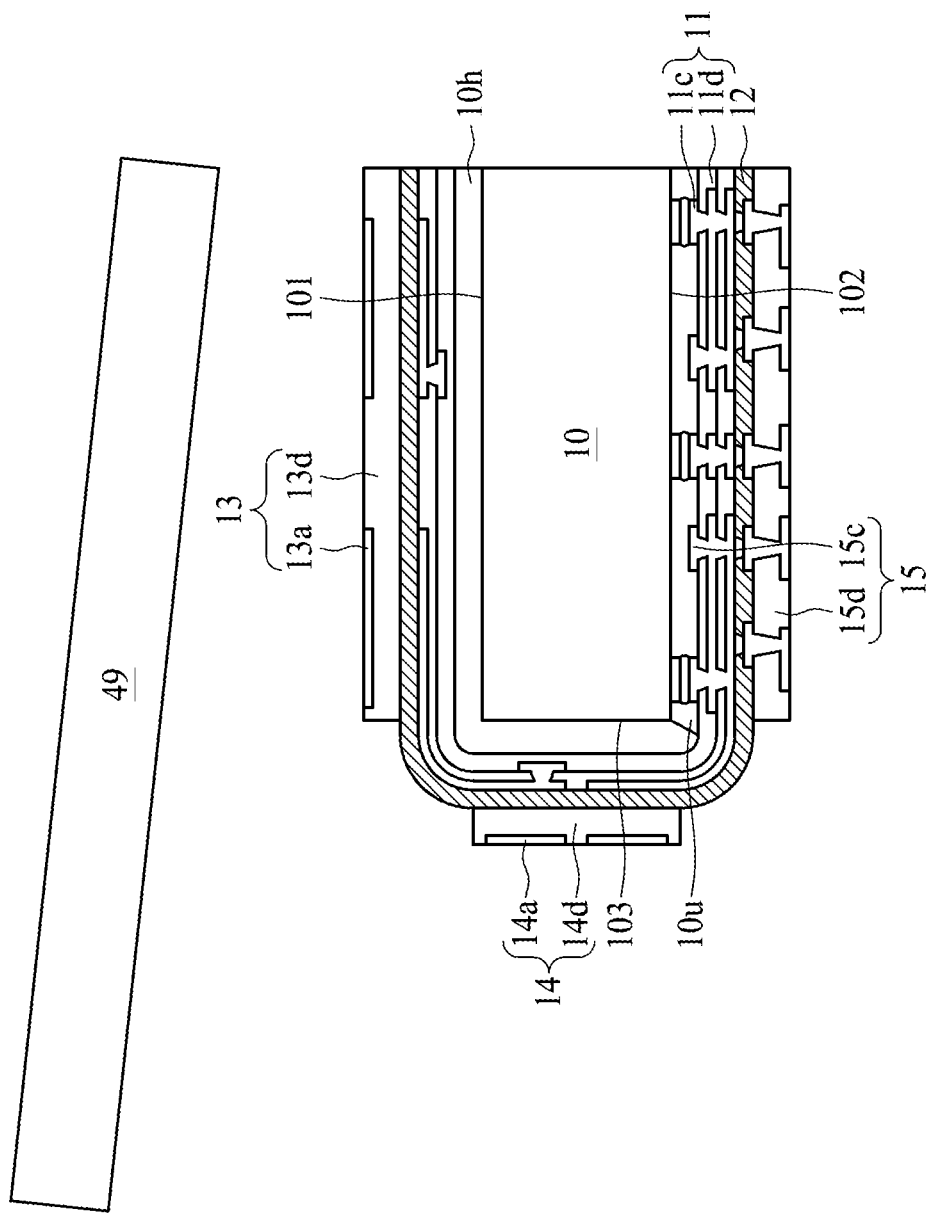
Figure 6F:
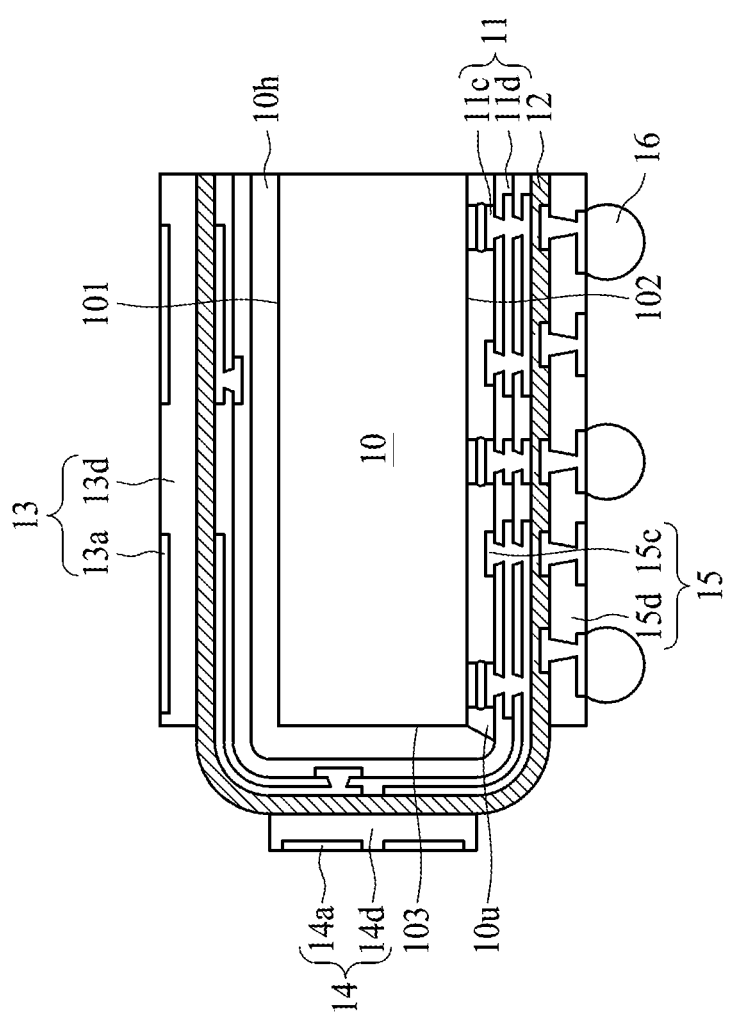

Referring to FIG. 6E, the carrier 49 is removed to expose the antenna layer 13. Electrical contacts 16 are formed on the conductive layer 15c of the circuit layer 15 as shown in FIG. 6F. In some embodiments, singulation may be performed to the structure as shown in FIG. 6F.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
   a first electronic component having an active surface and a first lateral surface;
   a first adhesive layer in contact with the active surface and the first lateral surface of the first electronic component; and
   a substrate connected to the active surface and the first lateral surface of the first electronic component through the first adhesive layer,
   wherein the substrate comprises a first antenna disposed over the first lateral surface of the first electronic component through the first adhesive layer,
   wherein the substrate further comprises a first dielectric layer and a second dielectric layer disposed over the first dielectric layer, wherein the second dielectric layer has an opening exposing a bending portion of the first dielectric layer, and wherein the first antenna is disposed over the second dielectric layer.

2. The semiconductor device package of claim 1, wherein the first electronic component further comprises a backside surface connected to the first adhesive layer, and wherein the first lateral surface of the first electronic component extends between the active surface and the backside surface of the first electronic component.

3. The semiconductor device package of claim 1, wherein the substrate further comprises a first circuit layer and a second circuit layer, wherein the first dielectric layer is disposed between the first circuit layer and the second circuit layer, wherein the first circuit layer is electrically connected to the second circuit layer through a conductive via penetrating the first dielectric layer, and wherein the first electronic component further comprises a conductive element penetrating the first adhesive layer and electrically connected to the first circuit layer.

4. The semiconductor device package of claim 1, wherein the first adhesive layer is conformally disposed on at least three surfaces of the first electronic component.

5. The semiconductor device package of claim 1, wherein the first electronic component further comprises a second lateral surface opposite to the first lateral surface of the first electronic component, and wherein a part of the second lateral surface of the first electronic component is exposed from the first adhesive layer.

6. The semiconductor device package of claim 1, further comprising:
   a second electronic component disposed over the substrate and connected to the first electronic component through a second adhesive layer.

7. The semiconductor device package of claim 6, wherein the first adhesive layer is in contact with an active surface and a lateral surface of the second electronic component.

8. The semiconductor device package of claim 1, wherein the second dielectric layer has a first portion and a second portion separated by the opening, wherein the first antenna is disposed over the first portion, and wherein the substrate further comprises a second antenna disposed over the second portion.

9. The semiconductor device package of claim 8, wherein the second antenna and the second portion of the second dielectric layer are disposed over a backside surface of the first electronic component.

10. A semiconductor device package, comprising:
    an electronic component having an active surface, a backside surface opposite to the active surface, and a first lateral surface extending between the active surface and the backside surface;
    a substrate having an interconnection structure, wherein the interconnection structure has a first portion disposed under the active surface, a second portion disposed adjacent to the first lateral surface, a first bending portion connecting the first portion and the second portion, and a third portion disposed over the backside surface; and
    a first antenna disposed over the third portion of the interconnection structure, wherein the first antenna is electrically connected to the electronic component through the third portion, the second portion, the first bending portion, and the first portion of the interconnection structure,
    wherein the interconnection structure further comprises a second bending portion connecting the second portion and the third portion.

11. The semiconductor device package of claim 10, wherein the first antenna comprises an antenna pattern and a dielectric layer, and wherein a top surface and a bottom surface of the antenna pattern are both at least partially covered by the dielectric layer.

12. The semiconductor device package of claim 10, further comprising:

an adhesive layer disposed between the electronic component and the first portion of the interconnection structure, wherein the electronic component further comprises a conductive element over the active surface and penetrating the adhesive layer, and wherein the conductive element extends from a first surface of the adhesive layer to a second surface of the adhesive layer.

13. The semiconductor device package of claim 10, wherein the interconnection structure further comprises a fourth portion adjacent to a second lateral surface of the electronic component opposite to the first lateral surface of the electronic component, and wherein the semiconductor device package further comprises:

a third antenna disposed over the fourth portion of the interconnection structure and adjacent to the second lateral surface of the electronic component, wherein the third antenna is electrically connected to the electronic component through the fourth portion, the third portion, the second portion, the first bending portion, and the first portion of the interconnection structure.

14. A semiconductor device package, comprising:

an electronic component having an active surface, a backside surface opposite to the active surface, and a first lateral surface extending between the active surface and the backside surface;

a substrate having an interconnection structure, wherein the interconnection structure has a first portion disposed under the active surface, a second portion disposed adjacent to the first lateral surface, a first bending portion connecting the first portion and the second portion, and a third portion disposed over the backside surface;

a first antenna disposed over the third portion of the interconnection structure, wherein the first antenna is electrically connected to the electronic component through the third portion, the second portion, the first bending portion, and the first portion of the interconnection structure; and a second antenna disposed over the second portion of the interconnection structure, wherein the second antenna is electrically connected to the electronic component through the second portion, the first bending portion, and the first portion of the interconnection structure.

* * * * *